(12) United States Patent
Cho et al.

(10) Patent No.: US 11,289,684 B2
(45) Date of Patent: Mar. 29, 2022

(54) DISPLAY DEVICE AND ELECTRONIC APPARATUS

(71) Applicant: Samsung Display Co., Ltd., Yongin-si (KR)

(72) Inventors: Junghyun Cho, Yongin-si (KR); Seunghoon Lee, Yongin-si (KR); Jinkoo Chung, Yongin-si (KR); Beohmrock Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 6 days.

(21) Appl. No.: 17/024,443

(22) Filed: Sep. 17, 2020

(65) Prior Publication Data

US 2021/0249635 A1  Aug. 12, 2021

(30) Foreign Application Priority Data

Feb. 12, 2020  (KR) ........................ 10-2020-0017139

(51) Int. Cl.
*G06F 3/041* (2006.01)
*H01L 51/52* (2006.01)
*H01L 27/32* (2006.01)
*G06F 3/044* (2006.01)

(52) U.S. Cl.
CPC ........ *H01L 51/5275* (2013.01); *G06F 3/0412* (2013.01); *H01L 27/322* (2013.01); *H01L 27/323* (2013.01); *H01L 27/3234* (2013.01); *H01L 27/3272* (2013.01);

(Continued)

(58) Field of Classification Search
CPC ............... G06F 3/041; H01L 27/14625; H01L 27/3225; H01L 27/3234
See application file for complete search history.

(56) References Cited

U.S. PATENT DOCUMENTS

| 6,072,450 A | 6/2000 | Yamada et al. |
| 7,535,646 B2 | 5/2009 | Chari et al. |
| 8,080,939 B2 | 12/2011 | Nomura et al. |

(Continued)

FOREIGN PATENT DOCUMENTS

| CN | 208507679 U | 2/2019 |
| CN | 109950296 A | 6/2019 |

(Continued)

*Primary Examiner* — Kevin M Nguyen
(74) *Attorney, Agent, or Firm* — Lewis Roca Rothgerber Christie LLP

(57) ABSTRACT

A display device includes: a substrate; two pixel circuits on the substrate spaced apart from each other with a transmission area therebetween, each of the two pixel circuits including a transistor and a storage capacitor; two display elements respectively electrically coupled to the two pixel circuits; a bottom metal layer between the substrate and the two pixel circuits and including a through hole at the transmission area; an encapsulation member on the two display elements; and an optical functional layer on the encapsulation member, wherein the optical functional layer includes: a first layer including a first opening, second openings, and a first slope portion, the first opening at the transmission area, the second openings corresponding to each of the two display elements, and the first slope portion being around the transmission area; and a second layer on the first layer.

25 Claims, 23 Drawing Sheets

(52) U.S. Cl.
CPC ...... *H01L 51/5253* (2013.01); *H01L 51/5281* (2013.01); *H01L 51/5284* (2013.01); *G06F 3/044* (2013.01)

(56) References Cited

U.S. PATENT DOCUMENTS

| | | | |
|---|---|---|---|
| 8,823,254 | B2 | 9/2014 | Ohta et al. |
| 9,142,802 | B2 | 9/2015 | Miyamoto et al. |
| 9,368,757 | B2 | 6/2016 | Choi et al. |
| 9,640,681 | B2 * | 5/2017 | Min .................. G02B 27/0018 |
| 9,780,118 | B2 * | 10/2017 | Nie ..................... H05K 5/0017 |
| 10,707,281 | B2 * | 7/2020 | Kuo ................... H01L 27/3234 |
| 2004/0141119 | A1 * | 7/2004 | Iijima ................... G02F 1/1397 |
| | | | 349/114 |
| 2011/0175118 | A1 * | 7/2011 | Hori .................... H01L 51/5284 |
| | | | 257/89 |
| 2012/0104368 | A1 | 5/2012 | Isobe et al. |
| 2014/0339509 | A1 | 11/2014 | Choi et al. |
| 2015/0333108 | A1 | 11/2015 | Miyamoto et al. |
| 2020/0133040 | A1 | 4/2020 | Bang et al. |
| 2020/0328267 | A1 | 10/2020 | Li et al. |

FOREIGN PATENT DOCUMENTS

| | | |
|---|---|---|
| EP | 3139411 A1 | 3/2017 |
| EP | 3139422 A2 | 3/2017 |
| JP | 2009-110873 A | 5/2009 |
| JP | 2010-96882 A | 4/2010 |
| JP | 2012-109214 A | 6/2012 |
| KR | 10-2013-0008660 A | 1/2013 |
| KR | 10-2014-0135568 A | 11/2014 |
| KR | 10-2014-0143916 A | 12/2014 |
| KR | 10-2020-0050059 A | 5/2020 |

\* cited by examiner

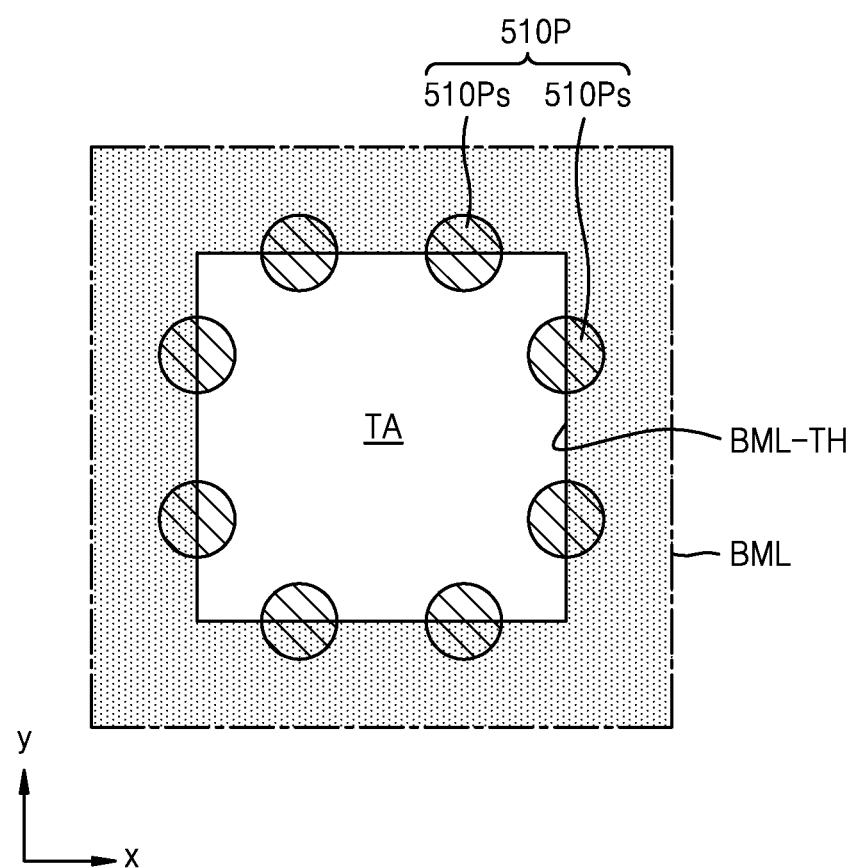

DISPLAY DEVICE AND ELECTRONIC APPARATUS

CROSS-REFERENCE TO RELATED APPLICATION

The present application claims priority to and the benefit of Korean Patent Application No. 10-2020-0017139, filed on Feb. 12, 2020, in the Korean Intellectual Property Office, the disclosure of which is incorporated herein in its entirety by reference.

BACKGROUND

1. Field

Aspects of one or more example embodiments relate to a display device and an electronic apparatus including the same.

2. Description of Related Art

Recently, the uses and applications of display devices has diversified. In addition, as display devices have become thinner and lighter, their range of uses has gradually expanded.

As the area occupied by a display area in display devices expands, various functions that are combined or associated with display devices have been added. In order to add various functions while expanding the display area, display devices may have a region for adding various functions inside a display area, not a function of displaying an image.

The above information disclosed in this Background section is only for enhancement of understanding of the background and therefore the information discussed in this Background section does not necessarily constitute prior art.

SUMMARY

In order to incorporate various functions into display devices, components such as cameras or sensors may be arranged in a display device. To arrange a component while securing a display area having a wider area in a display device, the component may be arranged to overlap the display area. In one method of arranging a component, a display device may include utilizing a transmission area through which light or sound of a certain wavelength may pass.

Additional aspects of some example embodiments will be set forth in part in the description which follows and, in part, will be more apparent from the description, or may be learned by practice of the presented example embodiments of the disclosure.

According to one or more example embodiments, a display device includes a substrate, two pixel circuits on the substrate to be apart from each other with a transmission area therebetween, each of the two pixel circuits including a transistor and a storage capacitor, two display elements respectively electrically coupled to the two pixel circuits, a bottom metal layer between the substrate and the two pixel circuits and including a through hole corresponding to the transmission area, an encapsulation member on the two display elements, and an optical functional layer on the encapsulation member, wherein the optical functional layer includes a first layer including a first opening, second openings, and a first slope portion, the first opening corresponding to the transmission area, the second openings corresponding to each of the two display elements, and the first slope portion being around the transmission area, and a second layer on the first layer and having a refractive index greater than a refractive index of the first layer.

According to some example embodiments, the first slope portion may entirely surround the transmission area when viewed in a direction perpendicular to the substrate.

According to some example embodiments, the first slope portion may include a plurality of sub-portions apart from one another.

According to some example embodiments, a lateral surface of the first slope portion may include a forward-tapered slope surface.

According to some example embodiments, the first layer may further include a second slope portion located inside the first opening.

According to some example embodiments, the first slope portion may be apart from the second slope portion.

According to some example embodiments, an edge of the bottom metal layer that defines the through hole may be located between the first slope portion and the second slope portion when viewed in a direction perpendicular to the substrate.

According to some example embodiments, a first width of the second slope portion may be less than a second width of the through hole of the bottom metal layer.

According to some example embodiments, the display device may further include an input sensing layer between the encapsulation layer and the optical functional layer and including at least one conductive layer and an insulating layer, the at least one conductive layer including a sensing electrode or a trace line.

According to some example embodiments, the first slope portion of the first layer may overlap the at least one conductive layer of the input sensing layer.

According to some example embodiments, the display device may further include a reflection prevention layer on the input sensing layer and including a black matrix and a color filter.

According to some example embodiments, the first slope portion of the first layer of the optical functional layer may overlap the black matrix.

According to some example embodiments, the black matrix may include a through hole corresponding to the transmission area, and a portion of the first layer may be in the through hole of the black matrix.

According to one or more example embodiments, an electronic apparatus includes a display device including an array of a plurality of pixels, the plurality of pixels including two pixels that are apart from each other with a transmission area therebetween, and a component overlapping at least the transmission area, wherein the display device includes a display layer including the plurality of pixels, a bottom metal layer including a through hole corresponding to the transmission area, an encapsulation member on the display layer, and an optical functional layer over the encapsulation member, wherein the optical functional layer includes a first layer including a first opening, second openings, and a first slope portion, the first opening corresponding to the transmission area, the second openings corresponding to each of the plurality of pixels, and the first slope portion being around the transmission area, and a second layer on the first layer and having a refractive index greater than a refractive index of the first layer.

According to some example embodiments, a lateral surface of the first slope portion may include a slope surface forward-tapered with respect to a top surface of a lower layer under the first layer.

According to some example embodiments, the lower layer may include an input sensing layer including at least one conductive layer and an insulating layer, the at least one conductive layer including a sensing electrode or a trace line.

According to some example embodiments, the first slope portion may overlap the at least one conductive layer of the input sensing layer.

According to some example embodiments, the lower layer may include a reflection prevention layer on the input sensing layer and including a black matrix and a color filter.

According to some example embodiments, the first slope portion of the first layer of the optical functional layer may overlap the black matrix.

According to some example embodiments, the black matrix may include a through hole corresponding to the transmission area, and a portion of the first layer may be in the through hole of the black matrix.

According to some example embodiments, the first layer may further include a second slope portion located inside the first opening.

According to some example embodiments, the first slope portion may be apart from the second slope portion.

According to some example embodiments, an edge of the bottom metal layer that defines the through hole may be located between the first slope portion and the second slope portion when viewed in a direction perpendicular to the substrate.

According to some example embodiments, a first width of the second slope portion may be less than a second width of the through hole of the bottom metal layer.

According to some example embodiments, the component may include a sensor or a camera.

These and/or other aspects and characteristics according to some example embodiments will become more apparent and more readily appreciated from the following description of the example embodiments, the accompanying drawings, and the claims and their equivalents.

BRIEF DESCRIPTION OF THE DRAWINGS

The above and other aspects, features, and characteristics of certain embodiments of the disclosure will be more apparent from the following description taken in conjunction with the accompanying drawings, in which:

FIGS. 9A to 9E are plan views of a slope portion of a first layer of an optical functional layer around a transmission area and a bottom metal layer in a display device according to some example embodiments;

DETAILED DESCRIPTION

Figure 1A:
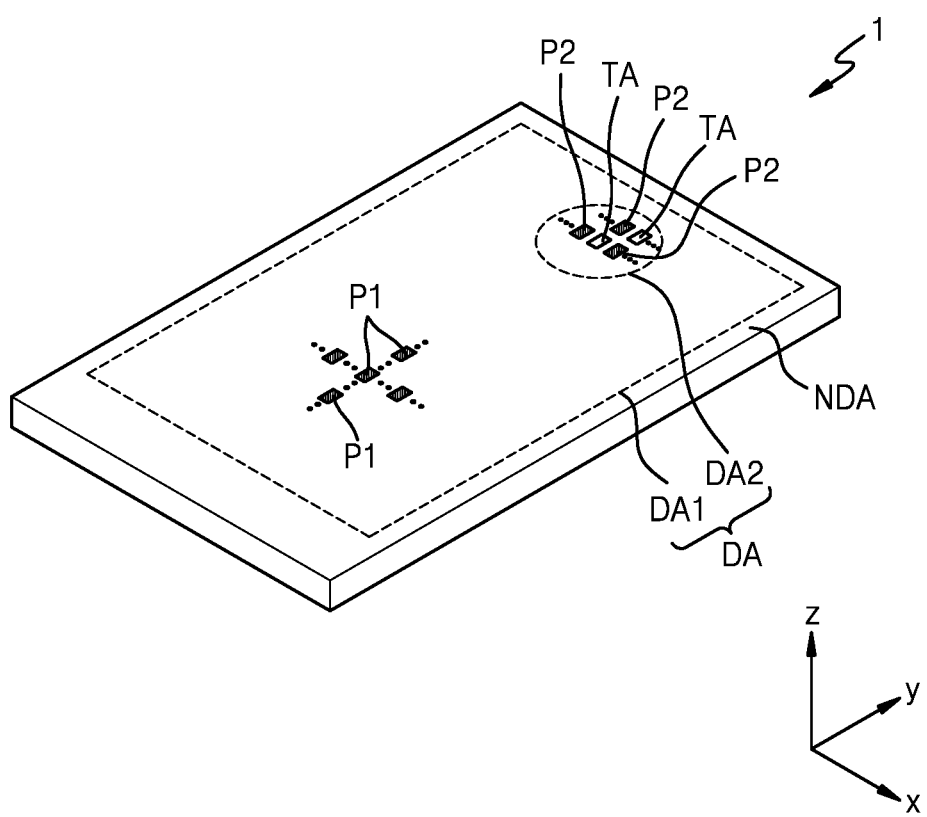
FIGS. 1A and 1B are perspective views of an electronic apparatus including a display device according to some example embodiments.

Reference will now be made in detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, aspects of some example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, aspects of some example embodiments of the present disclosure are described in more detail with reference to the accompanying drawings. When description is made with reference to the drawings, like reference numerals are used for like or corresponding elements and repeated descriptions thereof are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated or reduced for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

Figure 1B:
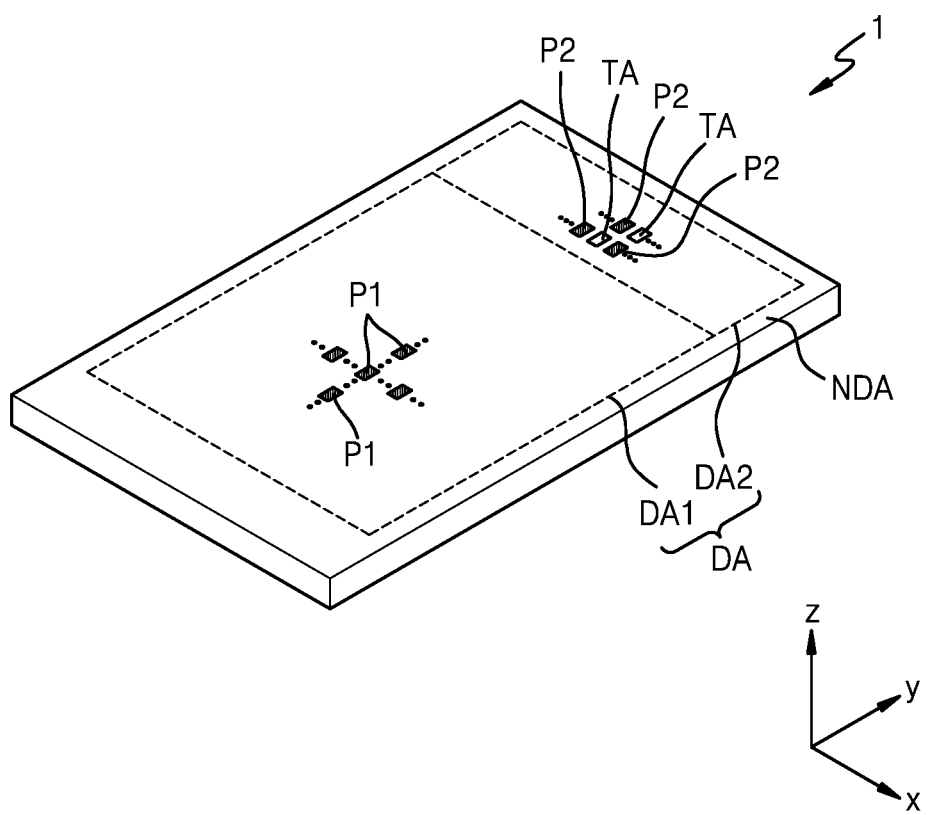

FIGS. 1A and 1B are perspective views of an electronic apparatus 1 including a display device according to some example embodiments.

Referring to FIGS. 1A and 1B, the electronic apparatus 1 may include a display area DA and a non-display area NDA outside the display area DA. For example, according to some example embodiments, the non-display area NDA may be located around a periphery, or outside a footprint of, the display area DA. The electronic apparatus 1 may display images through an array of a plurality of pixels two-dimensionally arranged in the display area DA (e.g., arranged in a matrix across a display surface of the display area DA). The plurality of pixels may include first pixels P1 and second pixels P2, the first pixels P1 being arranged in the first display area DA1, and the second pixels P2 being arranged in the second display area DA2.

The electronic apparatus 1 may display a first image by using light emitted from the first pixels P1 arranged in the first display area DA1 and display a second image by using light emitted from the second pixels P2 arranged in the second display area DA2. According to some example embodiments, the first image and the second image may include one portions of one of images displayed on the display area DA of the electronic apparatus 1. According to some example embodiments, the electronic apparatus 1 may display the first image and the second image that are independent of each other.

The second display area DA2 may include a transmission area TA located between the second pixels P2. The transmission area TA includes a region through which light may pass. Pixels are not arranged in the transmission area TA.

The non-display area NDA includes a region at which images are not displayed. The non-display area NDA may at least partially surround the display area DA. For example, the non-display area NDA may entirely surround the display area DA. A driver, etc. may be arranged in the non-display area NDA, the driver providing an electric signal or power to the first pixels P1 and the second pixels P2. A pad may be arranged in the non-display area NDA, the pad being a region to which an electronic element or a printed circuit board, etc. may be electrically connected.

The second display area DA2 may have a circular shape or an elliptical shape in a plan view as shown in FIG. 1A. Alternatively, the second display area DA2 may have a polygonal shape such as a quadrangular shape or a bar type as shown in FIG. 1B.

The second display area DA2 may be arranged inside the first display area DA1 (see FIG. 1A) or arranged on one side of the first display area DA1 (see FIG. 1B). As shown in FIG. 1A, the second display area DA2 may be entirely surrounded by the first display area DA1. According to some example embodiments, the second display area DA2 may be partially surrounded by the first display area DA1. For example, the second display area DA2 may be partially surrounded by the first display area DA1 while being located at a corner portion on one side of the first display area DA1.

A ratio of the second display area DA2 to the display area DA may be less than a ratio of the first display area DA1 to the display area DA. The electronic apparatus 1 may include one second display area DA2 as shown in FIG. 1A, or include two or more second display areas DA2.

The electronic apparatus 1 may include mobile phones, tablet personal computers (PC), notebook computers, smartwatches or smartbands worn on a wrist.

Figure 2A:
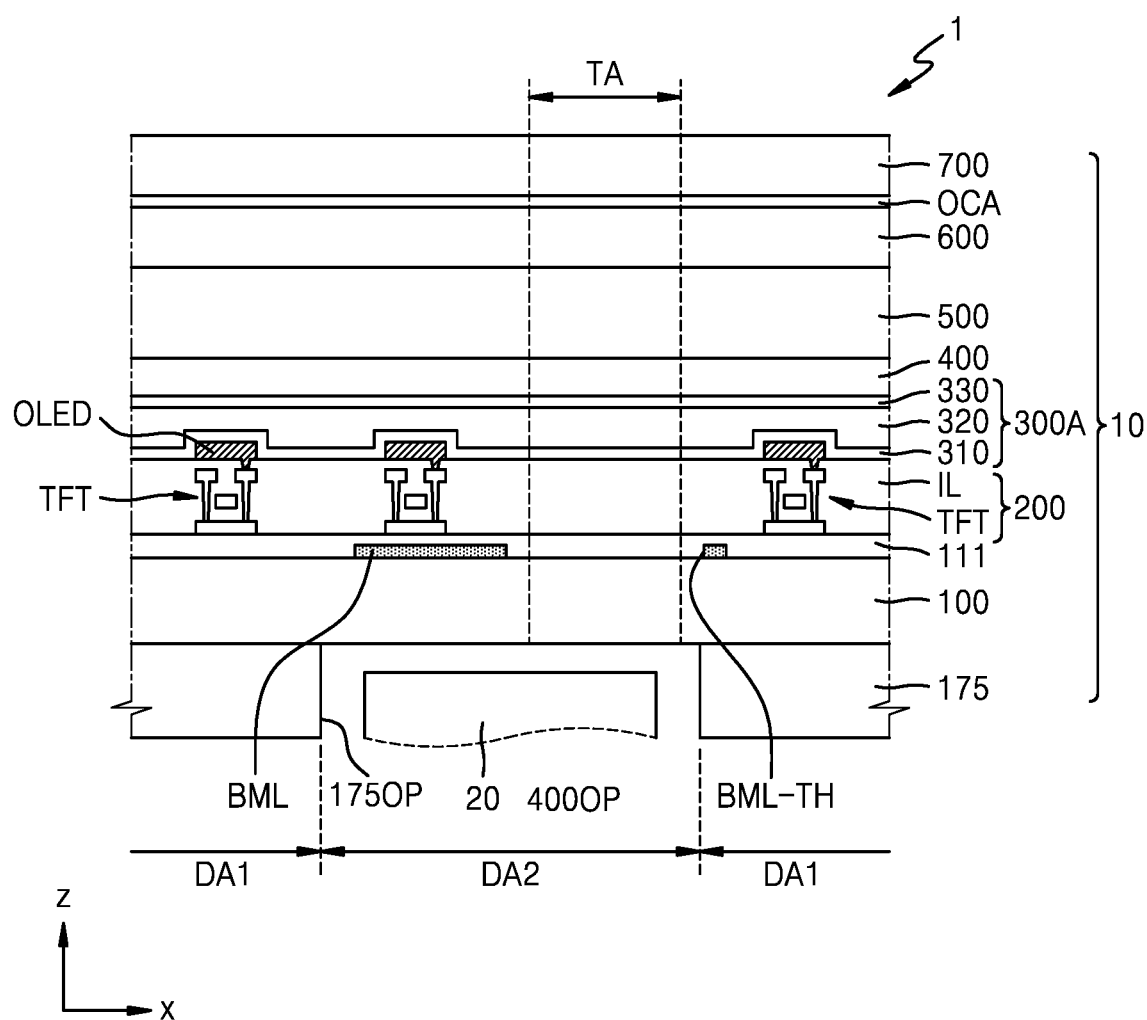
FIGS. 2A to 2C are cross-sectional views of a portion of an electronic apparatus including a display device according to some example embodiments.
Figure 2B:
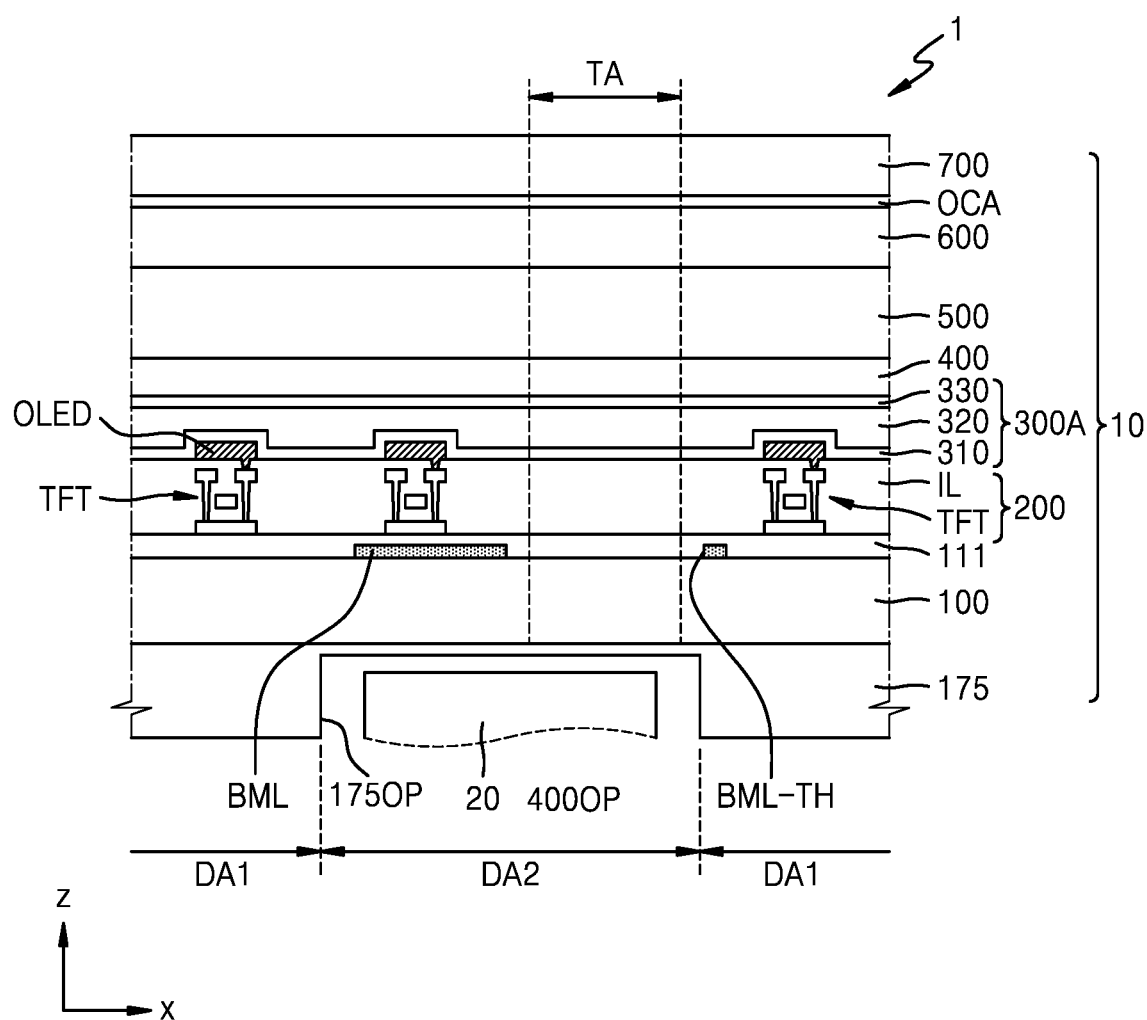
Figure 2C:
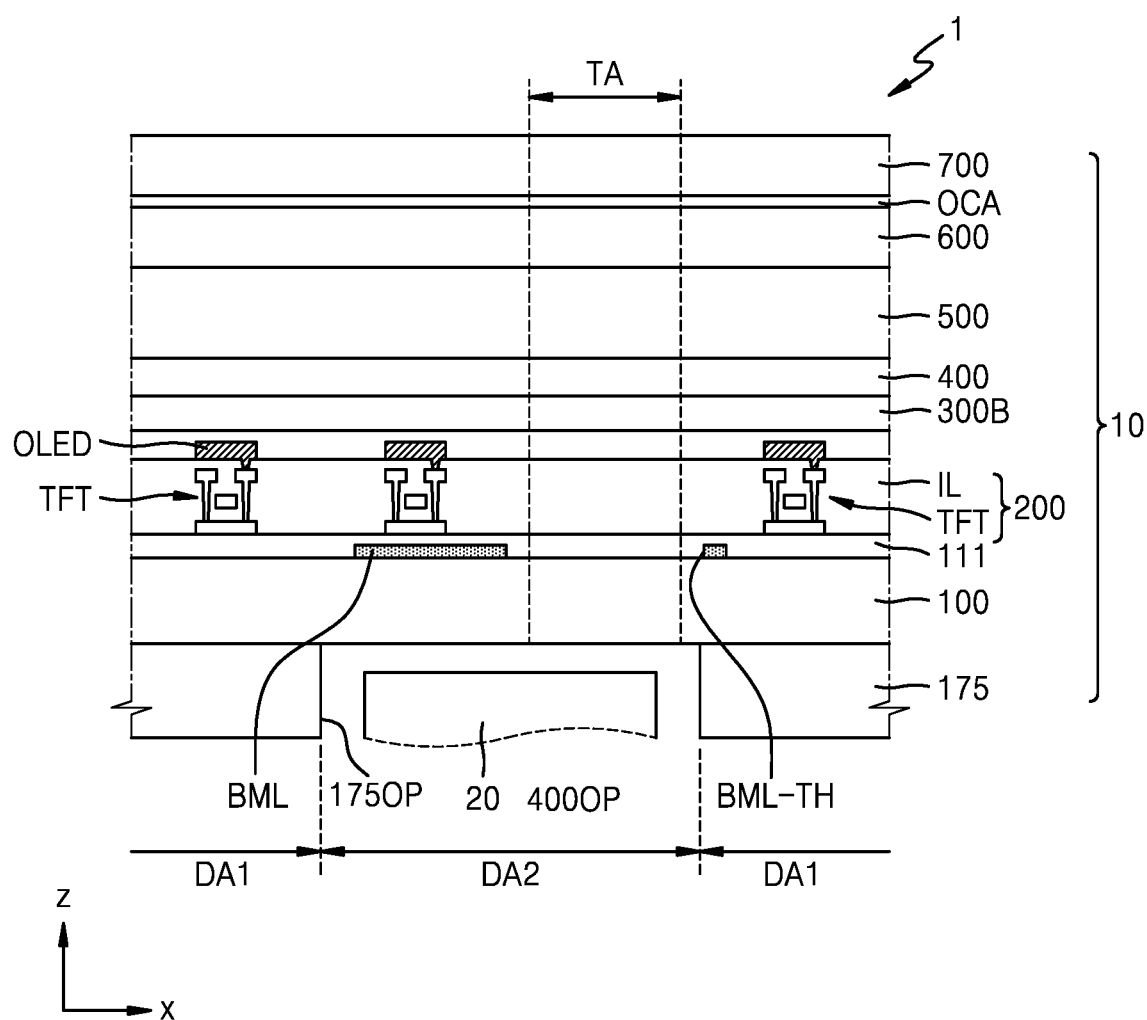

FIGS. 2A to 2C are cross-sectional views of a portion of the electronic apparatus 1 including a display device 1 according to some example embodiments.

Referring to FIGS. 2A to 2C, the electronic apparatus 1 may include the display device 10 and a component 20, the component 20 overlapping the display device 10.

The display device 10 may include a substrate 100, a display layer 200, a thin-film encapsulation layer 300A, an input sensing layer 400, an optical functional layer 500, a reflection prevention layer 600, and a window 700, the thin-film encapsulation layer 300A being on the display layer 200.

The component 20 may be located in the second display area DA2. The component 20 may include an electronic element that uses light or sound. For example, an electronic element may include a sensor measuring a distance such as a proximity sensor, a sensor recognizing an object or a portion (e.g., a fingerprint, an iris, a face, etc.) of a user's body, a small lamp outputting light, or an image sensor (e.g. a camera) capturing an image. The electronic element that uses light in various wavelengths including visible light, infrared light, ultraviolet light, etc. An electronic element that uses sound may use ultrasonic waves or sounds in a different frequency band. According to some example embodiments, the component 20 may include sub-components such as a light emitter and a light receiver. The light emitter and the light receiver may have an integrated structure, or a pair of light emitter and light receiver that have physically separated structures may constitute one component 20.

The substrate 100 may include glass or a polymer resin. In this case, the polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the polymer resin and an inorganic layer (not shown).

The display layer 200 may be arranged on a front surface of the substrate 100, and a bottom protective film 175 may be arranged on a rear surface of the substrate 100. The bottom protective film 175 may be attached to the rear surface of the substrate 100. An adhesive layer may be arranged between the bottom protective film 175 and the substrate 100. Alternatively, the bottom protective film 175 may be directly formed on the rear surface of the substrate 100. In this case, the adhesive layer is not arranged between the bottom protective film 175 and the substrate 100.

The bottom protective film 175 may support and protect the substrate 100. The bottom protective film 175 may include an opening 1750P corresponding to the second display area DA2. The opening 1750P of the bottom protective film 175 includes a concave portion formed when a portion of the bottom protective film 175 is removed in a thickness direction. According to some example embodiments, the opening 175OP of the bottom protective film 175 may be formed when a portion of the bottom protective film 175 is entirely removed in a thickness direction. In this case, as shown in FIGS. 2A and 2C, the opening 175OP may have a through-hole shape. According to some example embodiments, the opening 175OP may have a blind-hole shape as shown in FIG. 2B when a portion of the bottom protective film 175 is partially removed in a thickness direction.

Because the bottom protective film 175 includes the opening 175OP, a transmittance of the second display area DA2, for example, a light transmittance of the transmission area TA may be improved. The bottom protective film 175 may include an organic insulating material such as polyethylene terephthalate (PET) or polyimide (PI).

The display layer 200 may include a plurality of pixels. Each pixel may include a display element and emit red, green, or blue light. The display element may include an organic light-emitting diode OLED. According to some example embodiments, a region of the organic light-emitting diode OLED in which light is emitted may correspond to a pixel.

The display layer 200 may include a display element layer, a circuit layer, and an insulating layer IL, the display element layer including an organic light-emitting diode OLED, and the circuit layer including a thin film transistor TFT electrically connected to the organic light-emitting diode OLED. A thin film transistor TFT and an organic light-emitting diode OLED may be arranged in each of the first display area DA1 and the second display area DA2, the organic light-emitting diode OLED being electrically connected to the thin film transistor TFT.

The second display area DA2 may include the transmission area TA in which a thin film transistor TFT and an organic light-emitting diode OLED are not arranged. The transmission area TA may include a region through which light emitted from and/or directed to the component 20 may pass. In the display device 10, a transmittance of the transmission area TA may be 30% or more, 40% or more, 50% or more, 60% or more, 70% or more, 75% or more, 80% or more, 85% or more, or 90% or more.

A bottom metal layer BML may be arranged between the substrate 100 and the display layer 200, for example, between the substrate 100 and the thin film transistor TFT. The bottom metal layer BML may include a through hole BML-TH through which light emitted from and/or directed to the component 20 may pass. The through hole BML-TH of the bottom metal layer BML is located in the transmission area TA. A portion of the bottom metal layer BML in which the through hole BML-TH is not formed may prevent light from being diffracted through a narrow gap of the pixel circuit PC or between wirings connected to the pixel circuit PC arranged in the second display area DA2. The bottom metal layer BML may improve the performance of the thin film transistor TFT. A portion of the bottom metal layer BML does not exist in the transmission area TA. For example, the bottom metal layer BML may include a hole(s) located in the transmission area TA.

The display layer 200 may be sealed by an encapsulation member. According to some example embodiments, the encapsulation member may include the thin-film encapsulation layer 300A as shown in FIGS. 2A and 2B. The thin-film encapsulation layer 300A may include at least one inorganic encapsulation layer and at least one organic encapsulation layer. According to some example embodiments, the thin-film encapsulation layer 300A may include first and second inorganic encapsulation layers 310 and 330 and an organic encapsulation layer 320 therebetween.

According to some example embodiments, the encapsulation member may include an encapsulation substrate 300B as shown in FIG. 2C. The encapsulation substrate 300B may face the substrate 100 with the display layer 200 therebetween. There may be a gap between the encapsulation substrate 300B and the display layer 200. The encapsulation substrate 300B may include glass. Sealant may be arranged between the substrate 100 and the encapsulation substrate 300B. The sealant may be arranged in the non-display area NDA described with reference to FIG. 1A or 1B. The sealant arranged in the non-display area NDA may prevent penetration of moisture through a lateral surface of the display area DA while surrounding the display area DA.

The input sensing layer 400 may obtain coordinate information corresponding to an external input, for example, a touch event of an object such as a finger or a stylus pen. The input sensing layer 400 may include a touch electrode and trace lines connected to the touch electrode. The input sensing layer 400 may sense an external input by using a mutual capacitive method or a self-capacitive method.

The input sensing layer 400 may be arranged on the encapsulation member. Alternatively, the input sensing layer 400 may be formed separately and then coupled to the encapsulation member through an adhesive layer such as an optical clear adhesive OCA. According to some example embodiments, as shown in FIGS. 2A to 2C, the input sensing layer 400 may be directly formed on the thin-film encapsulation layer 300A or the encapsulation substrate 300B. In this case, the adhesive layer may not be arranged between the input sensing layer 400 and the thin-film encapsulation layer 300A or the encapsulation substrate 300B.

The optical functional layer 500 may improve a light efficiency. For example, the optical functional layer 500 may improve a front light efficiency and/or lateral visibility of light emitted from the organic light-emitting diode OLED and minimize or prevent diffraction of light directed to the component 20 through the transmission area TA.

The reflection prevention layer 600 may reduce reflectivity of light (external light) incident toward the display device 10 from the outside.

According to some example embodiments, the reflection prevention layer 600 may include an optical plate including a retarder and/or a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a structure or arrangement (e.g., a set or predetermined arrangement).

According to some example embodiments, as shown in FIG. 2C, the reflection prevention layer 600 may include a filter plate including a black matrix and color filters. The filter plate may include color filters, a black matrix, and an overcoat layer each arranged for each pixel.

According to some example embodiments, the reflection prevention layer 600 may include a destructive interference structure. The destructive interference structure may include a first reflective layer and a second reflective layer arranged on different layers. First-reflected light and second-reflected light respectively reflected by the first reflective layer and the second reflective layer may be destructively interfered and thus reflectivity of external light may be reduced.

The window 700 may be arranged on the reflection prevention layer 600 and coupled to the reflection prevention layer 600 by using the adhesive layer such as an optical clear adhesive OCA. Though it is shown in FIGS. 2A to 2C that the window 700 is arranged on the reflection prevention layer 600, the locations of the reflection prevention layer 600 and the optical functional layer 500 may be switched to each other according to some example embodiments. In this case, the window 700 may be coupled to the optical functional layer 500 by using the adhesive layer such as an optical clear adhesive OCA. According to some example embodiments, the optical clear adhesive OCA may be omitted between the window 700 and a layer (e.g. the reflection prevention layer or the optical functional layer) under the window 700.

One component 20 may be arranged or a plurality of components 20 may be arranged in the second display area DA2. In the case where the electronic apparatus 1 includes a plurality of components 20, the electronic apparatus 1 may include the number of second display areas DA2 corresponding to the number of components 20. For example, the electronic apparatus 1 may include the plurality of second display areas DA2 apart from each other. According to some example embodiments, the plurality of components 20 may be arranged in one second display area DA2. For example, the electronic apparatus 1 may include the bar type-second display area DA2 described with reference to FIG. 1B. The plurality of components 20 may be apart from each other in a lengthwise direction (e.g. an x-direction of FIG. 1) of the second display area DA2.

Though it is shown in FIGS. 2A to 2C that the display device 10 includes an organic light-emitting diode OLED as a display element, the display device 10 according to embodiments of the present disclosure are not limited thereto. According to some example embodiments, the display device 10 may include inorganic light-emitting displays including an inorganic material, or quantum dot light-emitting displays, the inorganic material including micro light-emitting diodes. For example, an emission layer of a display element of the display device 10 may include an organic material, an inorganic material, quantum dots, an organic material and quantum dots, or an inorganic material and quantum dots.

Figure 3A:
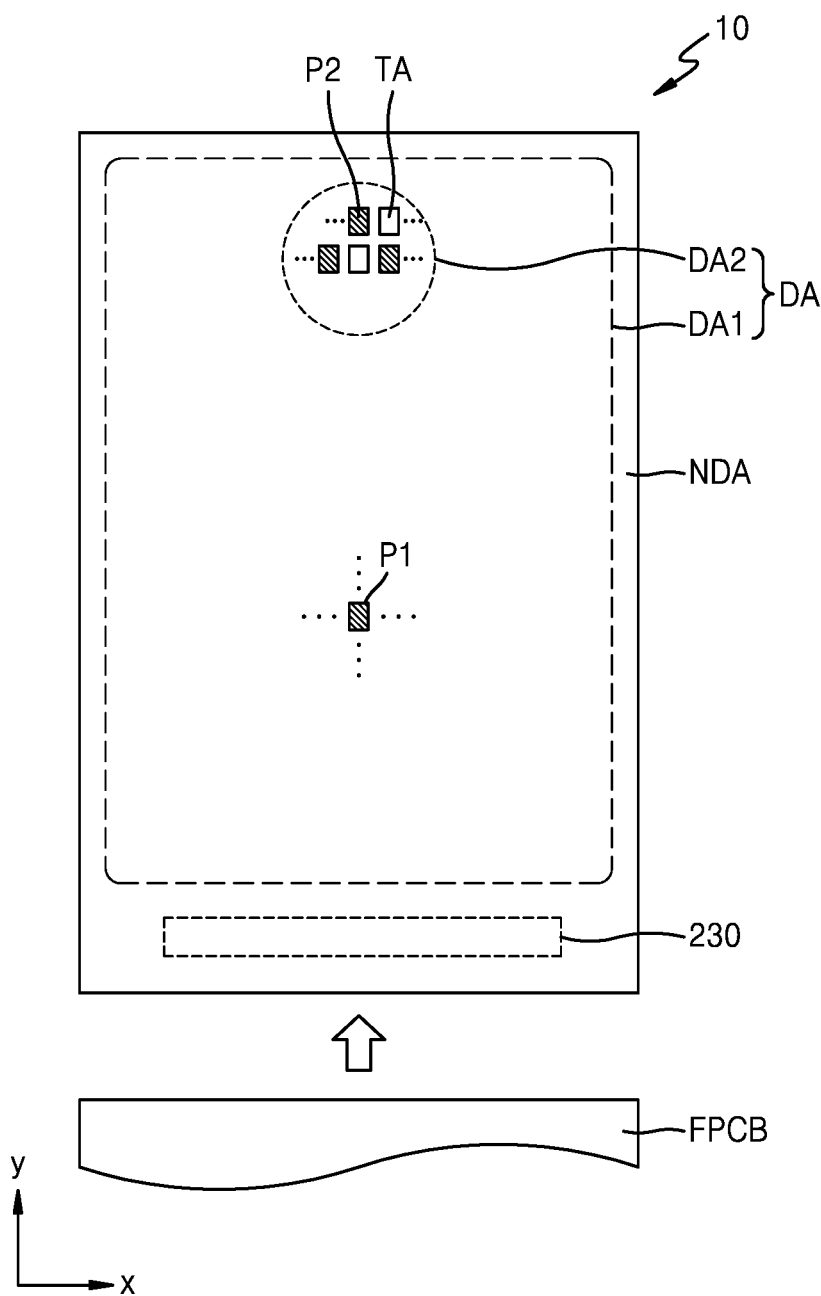
FIGS. 3A and 3B are plan views of a display device according to some example embodiments.
Figure 3B:
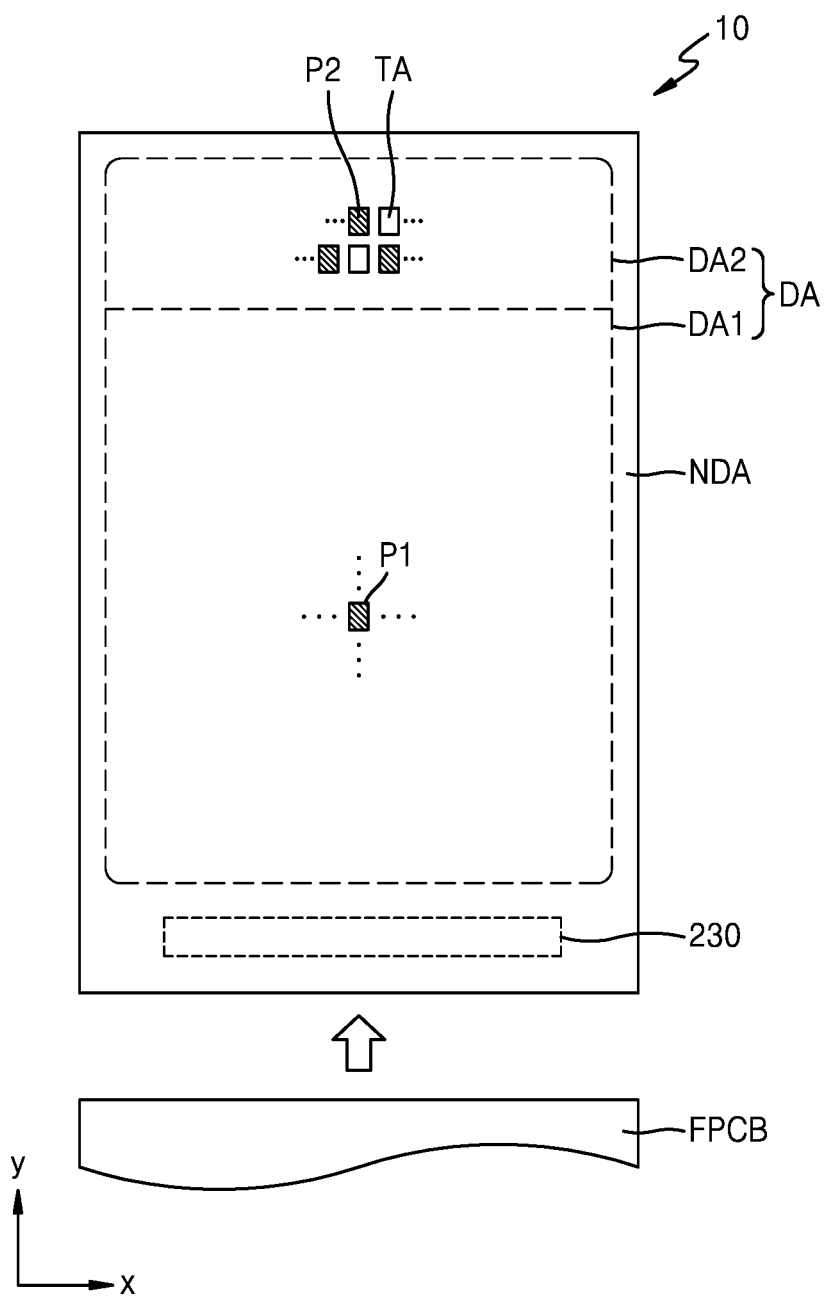

FIGS. 3A and 3B are plan views of the display device 10 According to some example embodiments.

Referring to FIGS. 3A and 3B, the display device 10 may include an array of a plurality of pixels arranged on the substrate 100. The plurality of pixels may include the first pixels P1 arranged in the first display area DA1 and the second pixels P2 arranged in the second display area DA2.

The display area DA includes the first display area DA1 and the second display area DA2. The area of the first display area DA1 may be different from the area of the second display area DA2. The area of the first display area DA1 may be greater than the area of the second display area DA2.

The first pixels P1 may be two-dimensionally arranged in the first display area DA1, and the second pixels P2 may be two-dimensionally arranged in the second display area DA2. The transmission area TA is arranged in the second display area DA2. The transmission area TA may be arranged between the second pixels P2 neighboring each other.

The non-display area NDA may entirely surround the display area DA. A scan driver, a data driver, etc. may be arranged in the non-display area NDA. A pad 230 may be arranged in the non-display area NDA. The pad 230 may neighbor one of the edges of the substrate 100. The pad 230 may be exposed by not being covered by an insulating layer and be electrically connected to a flexible printed circuit board FPCB. The flexible printed circuit board FPCB may electrically connect a controller to the pad 230 and supply a signal or power transferred from the controller. According to some example embodiments, a data driver may be arranged on the flexible printed circuit board FPCB. To transfer a signal or voltage of the flexible printed circuit board FPCB to the first pixels P1 or the second pixels P2, the pad 230 may be connected to a plurality of wirings.

According to some example embodiments, instead of the flexible printed circuit board FPCB, an integrated circuit may be arranged on the pad 230. The integrated circuit may include, for example, a data driver and may be electrically connected to the pad 230 through an anisotropic conductive film including a conductive ball.

Each of the first pixel P1 and the second pixel P2 may emit light having a color (e.g., a set or predetermined color) by using the organic light-emitting diode OLED (see FIGS. 2A to 2C). Each organic light-emitting diode OLED may emit, for example, red, green, or blue light. Each organic light-emitting diode OLED may be connected to a pixel circuit including a transistor and a capacitor.

Figure 4:
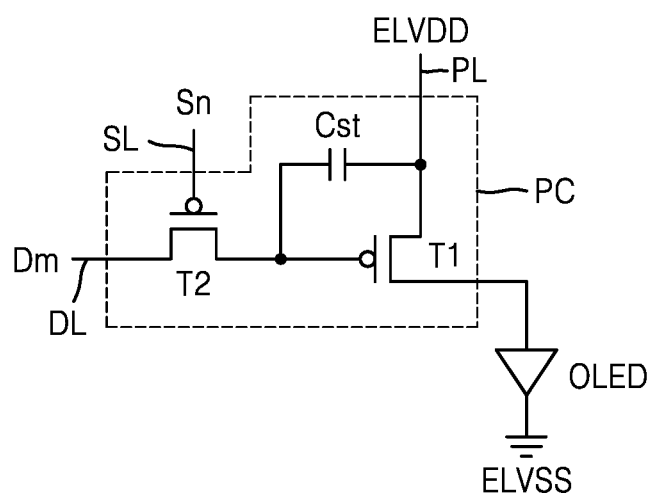
FIG. 4 is an equivalent circuit diagram of a pixel circuit connected to an organic light-emitting diode of a display device according to some example embodiments.

FIG. 4 is an equivalent circuit diagram of a circuit connected to an organic light-emitting diode OLED of the display device 10 according to some example embodiments.

Referring to FIG. 4, the organic light-emitting diode OLED is electrically connected to a pixel circuit PC. The pixel circuit PC may include a first thin film transistor T1, a second thin film transistor T2, and a storage capacitor Cst.

The second thin film transistor T2 is a switching thin film transistor, may be connected to a scan line SL and a data line DL, and may transfer a data voltage (or a data signal Dm) input from a data line DL to the first thin film transistor T1 based on a switching voltage (or a switching signal Sn) input from the scan line SL. A storage capacitor Cst may be connected to a second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor, may be connected to the driving voltage line PL and the storage capacitor Cst, and may control a driving current flowing through an organic light-emitting diode OLED from the driving voltage line PL in response to the voltage stored in the storage capacitor Cst. The organic light-emitting diode OLED may emit light having a brightness (e.g., a set or predetermined brightness) by using the driving current. An opposite electrode (e.g. a cathode) of the organic light-emitting diode OLED may receive a second power voltage ELVSS.

Though it is shown in FIG. 4 that a pixel circuit PC includes two thin film transistors and one storage capacitor, the embodiments according to the present disclosure are not limited thereto. The number of thin film transistors and the number of storage capacitors may be variously changed depending on a design of the pixel circuit PC. For example, the pixel circuit PC may include three, four, five or more thin film transistors.

Figure 5:
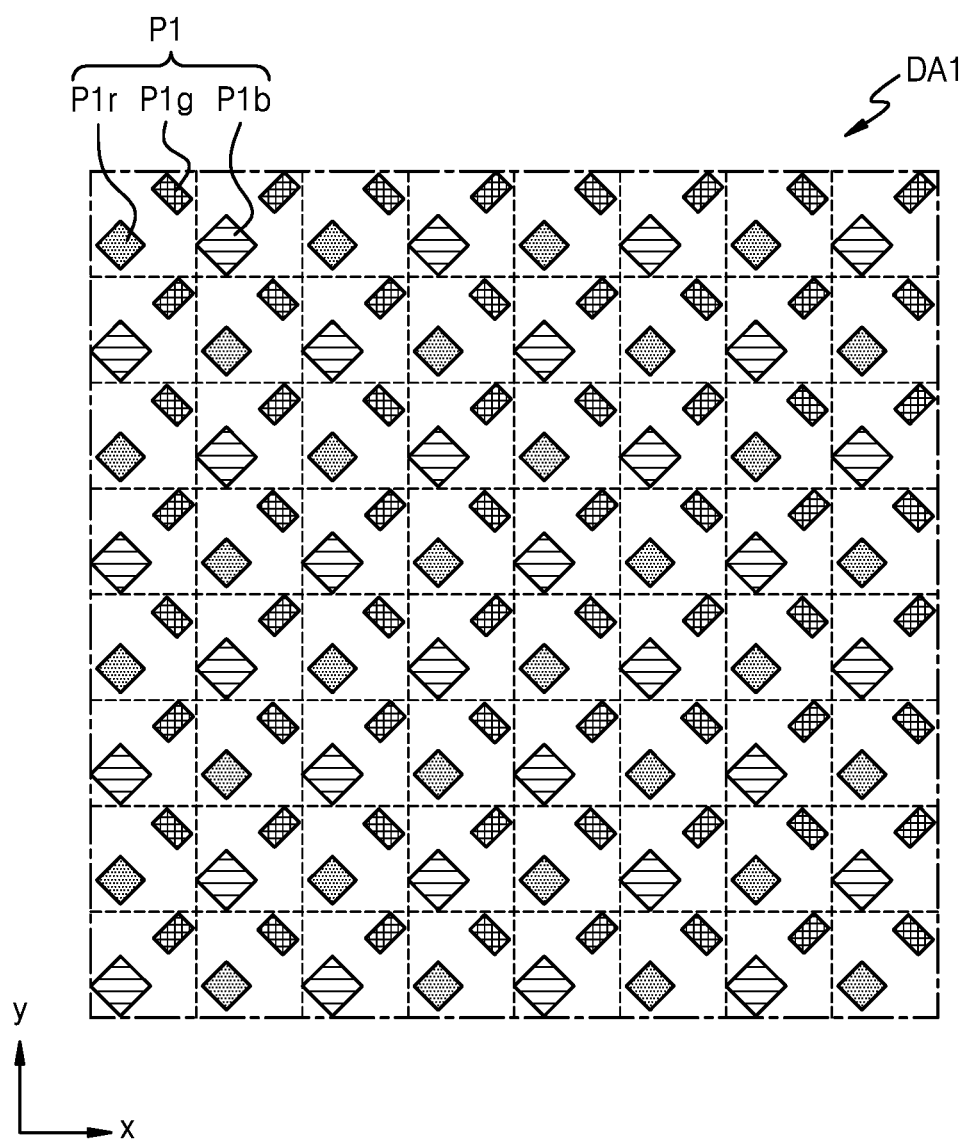
FIG. 5 is a plan view of a portion of a first display area of a display device according to some example embodiments.

FIG. 5 is a plan view of a portion of the first display area DA1 of the display device 10 according to some example embodiments.

Referring to FIG. 5, the first pixels P1 are arranged in the first display area DA1. The first pixels P1 may include a red first pixel P1*r*, a green first pixel P1*g*, and a blue first pixel P1*b*. According to some example embodiments, as shown in FIG. 5A, a red first pixel P1*r*, a green first pixel P1*g*, and a blue first pixel P1*b* may be arranged in a pentile type-configuration. According to some example embodiments, a red first pixel P1r, a green first pixel P1g, and a blue first pixel P1b may be arranged in a stripe type-configuration.

A red first pixel P1r, a green first pixel P1g, and a blue first pixel P1b may respectively have different sizes (or widths). For example, a blue first pixel P1b may be greater than a red first pixel P1r and a green first pixel P1g. A red first pixel P1r may be greater than a green first pixel P1g. According to some example embodiments, a green first pixel P1g may have a rectangular shape and neighboring green first pixels P1g may extend in different directions.

Figure 6A:
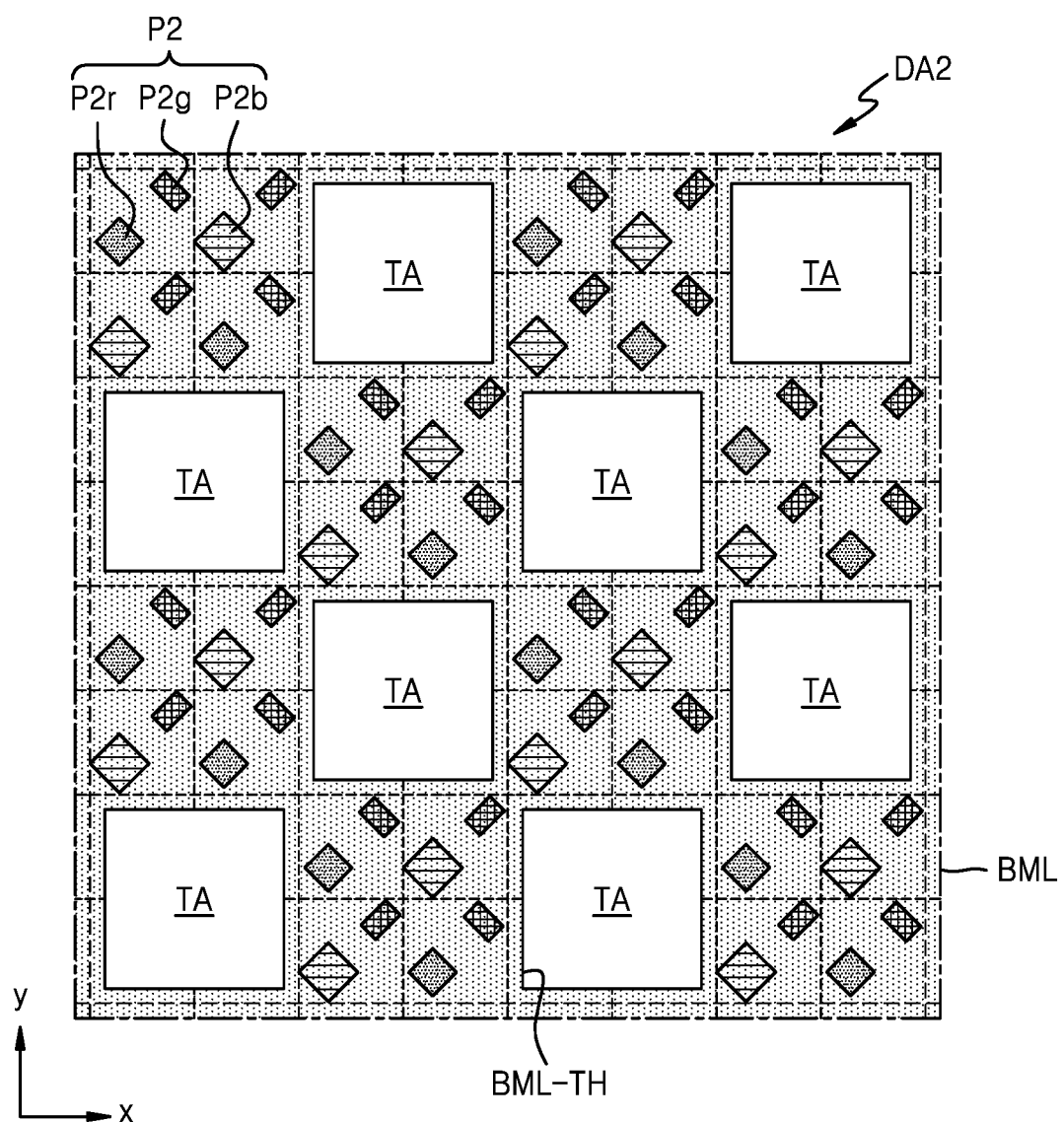
FIGS. 6A to 6C are plan views of a portion of a second display area of a display device according to some example embodiments.
Figure 6B:
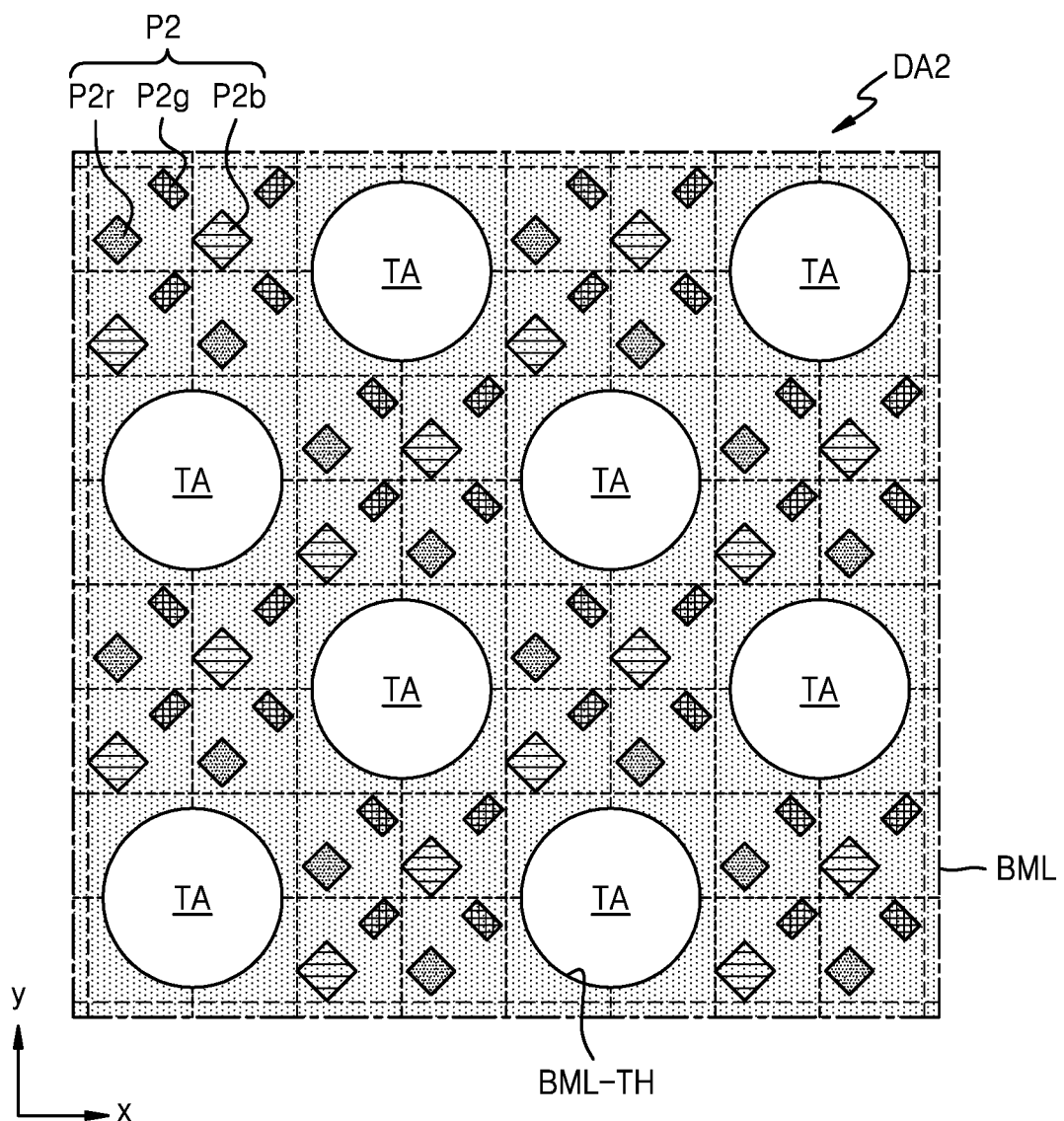
Figure 6C:
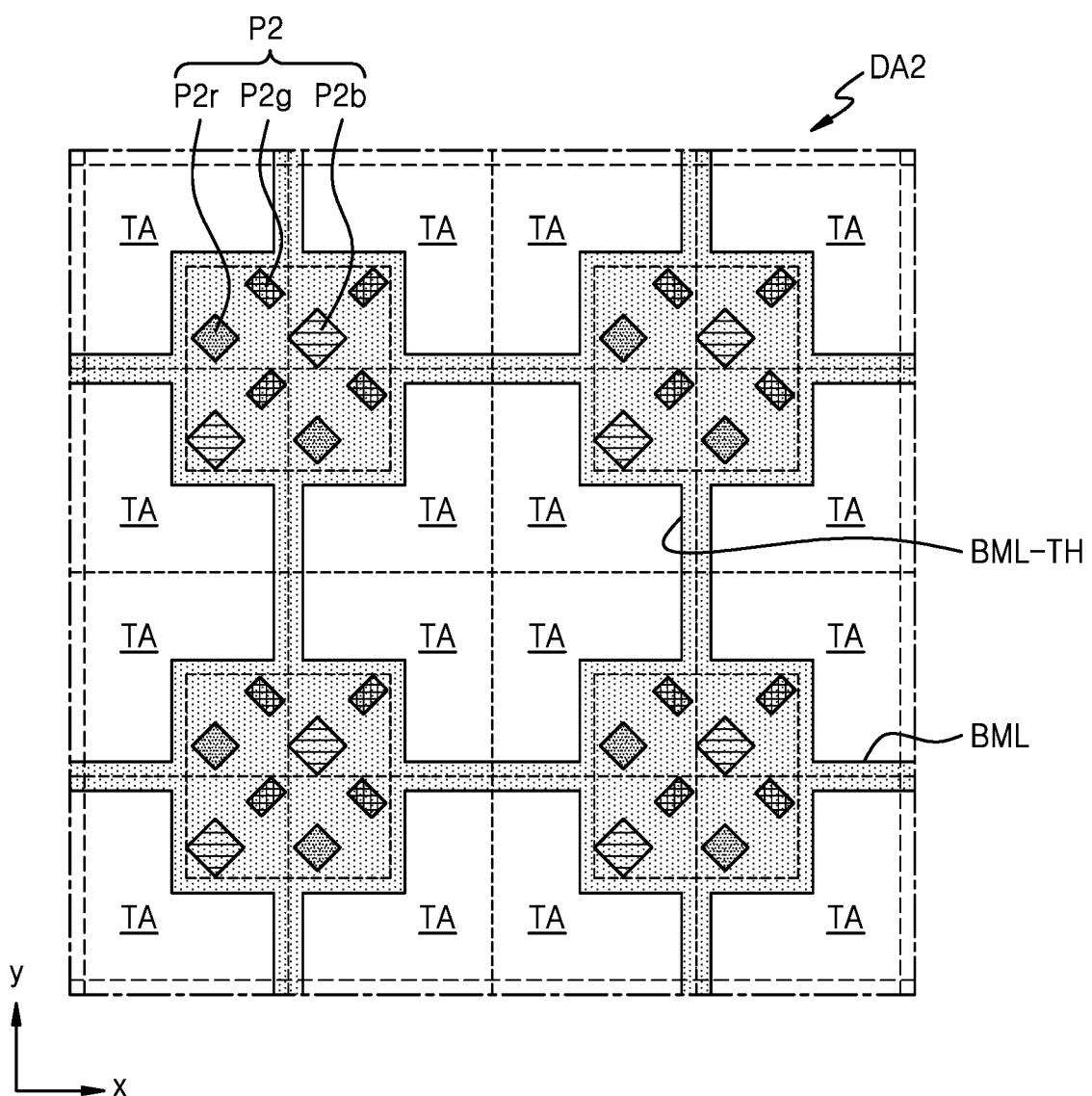

FIGS. 6A to 6C are plan views of a portion of the second display area DA2 of the display device according to some example embodiments.

Referring to FIGS. 6A to 6C, the second pixels P2 are arranged in the second display area DA2. The second pixels P2 may include a red first pixel P1r, a green first pixel P1g, and a blue first pixel P1b. According to some example embodiments, a red second pixel P2r, a green second pixel P2g, and a blue second pixel P2b may be arranged in a pentile type-configuration. According to some example embodiments, a red second pixel P2r, a green second pixel P2g, and a blue second pixel P2b may be arranged in a stripe type-configuration.

The transmission area TA may be arranged to neighbor the second pixels P2. For example, the transmission area TA may be arranged between the second pixels P2. The transmission areas TA may be arranged in a direction oblique to an x-direction and a y-direction as shown in FIGS. 6A and 6B, or arranged to neighbor each other as shown in FIG. 6C.

The bottom metal layer BML may be arranged in the second display area DA2 and may include the through hole BML-TH corresponding to the transmission area TA. According to some example embodiments, the through hole BML-TH may have an approximately quadrangular shape in a plan view as shown in FIG. 6A, have an approximately circular shape as shown in FIG. 6B, or have an elliptical shape. According to some example embodiments, the through hole BML-TH may have a cross shape as shown in FIG. 6C. The through hole BML-TH may have various shapes.

Figure 7:
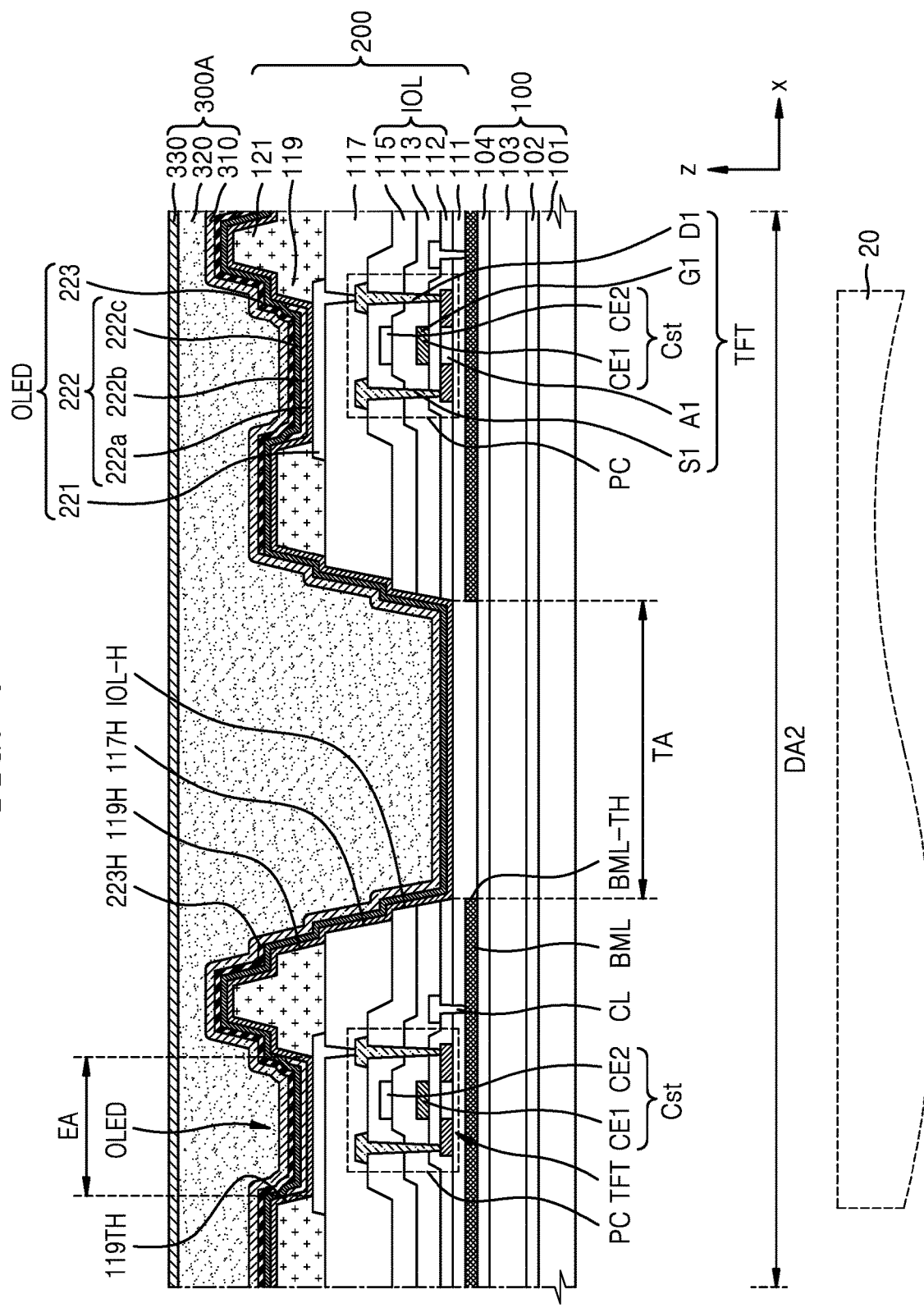
FIG. 7 is a cross-sectional view of a portion of a display panel of a display device according to some example embodiments.

FIG. 7 is a cross-sectional view of a portion of a display panel of the display device according to some example embodiments. FIG. 7 is a cross-sectional view of the display panel of the display device. The display panel may include the substrate 100, the display layer 200, and the encapsulation member. According to some example embodiments, FIG. 7 shows the thin-film encapsulation layer 300A as the encapsulation member.

Referring to FIG. 7, the substrate 100 may have a multi-layered structure. The substrate 100 may include a first base layer 101, a first inorganic layer 102, a second base layer 103, and a second inorganic layer 104 that are sequentially stacked.

Each of the first base layer 101 and the second base layer 103 may include a polymer resin. The polymer resin may include polyethersulfone (PES), polyacrylate (PAR), polyetherimide (PEI), polyethylene naphthalate (PEN), polyethylene terephthalate (PET), polyphenylene sulfide (PPS), polyimide (PI), polycarbonate, cellulose tri acetate (TAC), and cellulose acetate propionate (CAP). The polymer resin may be transparent.

Each of the first inorganic layer 102 and the second inorganic layer 104 includes a barrier layer preventing the penetration of external foreign substances and may include a single layer or a multi-layer including an inorganic material such as silicon nitride, silicon oxynitride, and/or silicon oxide.

A buffer layer 111 may reduce or block the penetration of foreign substances, moisture, or external air from below the substrate 100 and provide a flat surface on the substrate 100. The buffer layer 111 may include an inorganic insulating material such as silicon oxide, silicon oxynitride, and silicon nitride and have a single-layered structure or a multi-layered structure including the above materials.

The bottom metal layer BML may be arranged between the substrate 100 and the buffer layer 111. The bottom metal layer BML may include the through hole BML-TH corresponding to the transmission area TA. The bottom metal layer BML may include a metal having conductivity such as aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu).

The bottom metal layer BML may be electrically connected to a conductive line CL. The conductive line CL may be electrically connected to a gate electrode, a source electrode, or a drain electrode of a thin film transistor TFT described below or electrically connected to one of capacitor plates of a storage capacitor Cst. Alternatively, the conductive line CL may be electrically connected to the driving voltage line PL (see FIG. 4). Through the conductive line CL, the bottom metal layer BML may be electrically connected to a gate electrode, a source electrode, or a drain electrode of a thin film transistor TFT, electrically connected to one of capacitor plates of a storage capacitor Cst, or electrically connected to the driving voltage line PL. The bottom metal layer BML connected to the conductive line CL may protect the thin film transistor TFT from electrostatic discharge or improve the performance of the thin film transistor TFT.

The pixel circuit PC including the thin film transistor TFT and the storage capacitor Cst may be arranged on the buffer layer 111. The thin film transistor TFT may include a semiconductor layer A1, a gate electrode G1, a source region S1, and a drain region D1, the gate electrode G1 overlapping a channel region of the semiconductor layer A1, and the source electrode S1 and the drain electrode D1 being respectively connected to a source region and a drain region of the semiconductor layer A1. A gate insulating layer 112 may be arranged between the semiconductor layer A1 and the gate electrode G1. A first interlayer insulating layer 113 and a second interlayer insulating layer 115 may be arranged between the gate electrode G1 and the source electrode S1 or between the gate electrode G1 and the drain electrode D1.

The storage capacitor Cst may overlap the thin film transistor TFT. The storage capacitor Cst may include a first capacitor plate CE1 and a second capacitor plate CE2 overlapping each other. According to some example embodiments, the gate electrode G1 of the thin film transistor TFT may include the first capacitor plate CE1 of the storage capacitor Cst. The first interlayer insulating layer 113 may be arranged between the first capacitor plate CE1 and the second capacitor plate CE2.

The semiconductor layer A1 may include polycrystalline silicon. According to some example embodiments, the semiconductor layer A1 may include amorphous silicon. According to some example embodiments, the semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The semiconductor layer A1 may include a channel region, a source region, and a drain region, the source region and the drain region being doped with impurities.

The gate insulating layer 112 may include an inorganic insulating material such as silicon oxide, silicon oxynitride, and silicon nitride and have a single-layered structure or a multi-layered structure including the above materials.

The gate electrode G1 or the first capacitor plate CE1 may include a low-resistance conductive material such as molybdenum (Mo), aluminum (Al), copper (Cu), and/or titanium (Ti) and have a single-layered structure or a multi-layered structure including the above materials.

The first interlayer insulating layer 113 may include an inorganic insulating material such as silicon oxide, silicon oxynitride, and silicon nitride and have a single-layered structure or a multi-layered structure including the above materials.

The second capacitor plate CE2 may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) and have a single-layered structure or a multi-layered structure including the above materials.

The second interlayer insulating layer 115 may include an inorganic insulating material such as silicon oxide, silicon oxynitride, and silicon nitride and have a single-layered structure or a multi-layered structure including the above materials.

The source electrode S1 or the drain electrode D1 includes aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single-layered structure or a multi-layered structure including the above materials. For example, the source electrode S1 or the drain electrode D1 may have a three-layered structure of a titanium layer/aluminum layer/titanium layer.

A planarization insulating layer 117 may include a material different from that of at least one inorganic insulating layer IOL thereunder, for example, the gate insulating layer 112, the first interlayer insulating layer 113, and the second interlayer insulating layer 115. The planarization insulating layer 117 may include an organic insulating material such as acryl, benzocyclobutene (BCB), polyimide, or hexamethyldisiloxane (HMDSO).

A pixel electrode 221 may be arranged on the planarization insulating layer 117. The pixel electrode 221 may be electrically connected to the thin film transistor TFT through a contact hole formed in the planarization insulating layer 117.

The pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The pixel electrode 221 may include a reflective layer including the above material and a transparent conductive layer on and/or under the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 221 may have a three-layered structure of an ITO layer/an Ag layer/an ITO layer that are sequentially stacked.

A pixel-defining layer 119 may cover the edges of the pixel electrode 221 and include a through hole 119TH exposing the center of the pixel electrode 221. The pixel-defining layer 119 may include an organic insulating material such as benzocyclobutene (BCB), polyimide, or hexamethyldisiloxane (HMDSO). The through hole 119TH of the pixel-defining layer 119 may define an emission area EA. Red, green, or blue light may be emitted through the emission area EA. The area or width of the emission area EA may define the area or width of a pixel.

A spacer 121 may be formed on the pixel-defining layer 119. The spacer 121 may prevent layers under the spacer 121 from being damaged by a mask during a process of forming an intermediate layer 222 described below. The spacer 121 may include the same material as that of the pixel-defining layer 119.

The intermediate layer 222 may include an emission layer 222b overlapping the pixel electrode 221. The emission layer 222b may include an organic material. The emission layer 222b may include a polymer organic material or a low molecular weight organic material emitting light having a color (e.g., a set or predetermined color). The emission layer 222b may be formed through a deposition process that uses the mask as described above.

A first functional layer 222a and a second functional layer 222c may be respectively arranged under and/or on the emission layer 222b.

The first functional layer 222a may include a single layer or a multi-layer. For example, in the case where the first functional layer 222a includes a polymer material, the first functional layer 222a may include a hole transport layer (HTL), which has a single-layered structure, and include poly(3,4-ethylenedioxythiophene) (PEDOT) or polyaniline (PANI). In the case where the first functional layer 222a includes a low molecular weight material, the first functional layer 222a may include a hole injection layer (HIL) and a hole transport layer (HTL).

The second functional layer 222c may be omitted. For example, in the case where the first functional layer 222a and the emission layer 222b include a polymer material, according to some example embodiments, the second functional layer 222c may be formed. The second functional layer 222c may include a single layer or a multi-layer. The second functional layer 222c may include an electronic transport layer (ETL) and/or an electron injection layer (EIL).

Each of the first functional layer 222a and the second functional layer 222c may be formed as one body to entirely cover the display area. As shown in FIG. 7, the first functional layer 222a and the second functional layer 222c may be formed as one body over the display area.

An opposite electrode 223 may include a conductive material having a relatively small work function. For example, the opposite electrode 223 may include a (semi) transparent layer including silver (Ag), magnesium (Mg), aluminum (Al), nickel (Ni), chromium (Cr), lithium (Li), calcium (Ca), or an alloy thereof. Alternatively, the opposite electrode 223 may further include a layer including ITO, IZO, ZnO, or $In_2O_3$ on the (semi) transparent layer including the above material. According to some example embodiments, the opposite electrode 223 may include silver (Ag) and magnesium (Mg). The opposite electrode 223 may include a fourth hole 223H located in the transmission area TA and be formed as one body over the display area.

A stacked structure of the pixel electrode 221, the intermediate layer 222, and the opposite electrode 223 that are sequentially stacked may constitute a light-emitting diode, for example, an organic light-emitting diode OLED. The display layer 200 may be covered by the thin-film encapsulation layer 300A, the display layer 200 including insulating layers and the organic light-emitting diode.

The thin-film encapsulation layer 300A may include the first and second inorganic encapsulation layers 310 and 330 and the organic encapsulation layer 320 therebetween.

The first and second inorganic encapsulation layers 310 and 330 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by chemical vapor deposition.

The organic encapsulation layer 320 may include a polymer-based material. The polymer-based material may include an acryl-based resin, an epoxy-based resin, polyimide, and polyethylene. For example, the organic encapsulation layer 320 may include an acrylic resin, for example, polymethylmethacrylate, poly acrylic acid, etc. The organic encapsulation layer 320 may be formed by hardening a monomer or coating a polymer.

Because the second display area DA2 includes the transmission area TA, it is shown in FIG. 7 that two pixel circuits PC and two organic light-emitting diodes OLED neighbor each other with the transmission area TA therebetween.

Insulating layers on the substrate 100, for example, at least one of inorganic insulating layer ILO, the planarization insulating layer 117, or the pixel-defining layer 119 may include a hole corresponding to the transmission area TA. The at least one inorganic insulating layer ILO may include at least one of the gate insulating layer 112, the first interlayer insulating layer 113, or the second interlayer insulating layer 115.

A first hole IOL-H of the at least one inorganic insulating layer ILO, a second hole 117H of the planarization insulating layer 117, or a third hole 119H of the pixel-defining layer 119 may overlap each other in the transmission area TA. The opposite electrode 223 may include the fourth hole 223H located in the transmission area TA. The fourth hole 223H may overlap the first hole IOL-H, the second hole 117H, and the third hole 119H. The first hole IOL-H may have the shape of a through hole passing through a stacked body of the gate insulating layer 112, the first interlayer insulating layer 113, and the second interlayer insulating layer 115 or have the shape of a blind hole formed by removing a portion of the stacked body in a thickness direction of the stacked body. The second hole 117H, the third hole 119H, and the fourth hole 223H each may have the shape of a through hole.

Some of the insulating layers, for example, the buffer layer 111 and the second inorganic layer 104 may not include a hole located in the transmission area TA. For example, as shown in FIG. 7, the buffer layer 111 and the second inorganic layer 104 may cover the transmission area TA. According to some example embodiments, the buffer layer 111 and/or the second inorganic layer 104 may include a hole located in the transmission area TA.

The sizes or widths of the first hole IOL-H, the second hole 117H, the third hole 119H, and the fourth hole 223H may be different from each other. Though it is shown in FIG. 7 that the width of the first hole IOL-H is substantially the same as the width of the through hole BML-TH of the bottom metal layer BML, the embodiments according to the present disclosure are not limited thereto. According to some example embodiments, the width of the first hole IOL-H may be greater or less than the width of the through hole BML-TH of the bottom metal layer BML.

Though it is shown in FIG. 7 that the thin-film encapsulation layer 300A is arranged on the organic light-emitting diode OLED, the encapsulation substrate 300B (see FIG. 2C) may be arranged on the organic light-emitting diode OLED according to some example embodiments. FIG. 7 describes a cross-sectional structure of the second display area DA2, the organic light-emitting diode and the pixel circuit may be arranged for every first pixel of the first display area DA1, the pixel circuit being connected to the organic light-emitting diode. The relevant structure may be the same as the structure of the organic light-emitting diode OLED and the pixel circuit PC described with reference to FIG. 7.

Figure 8A:
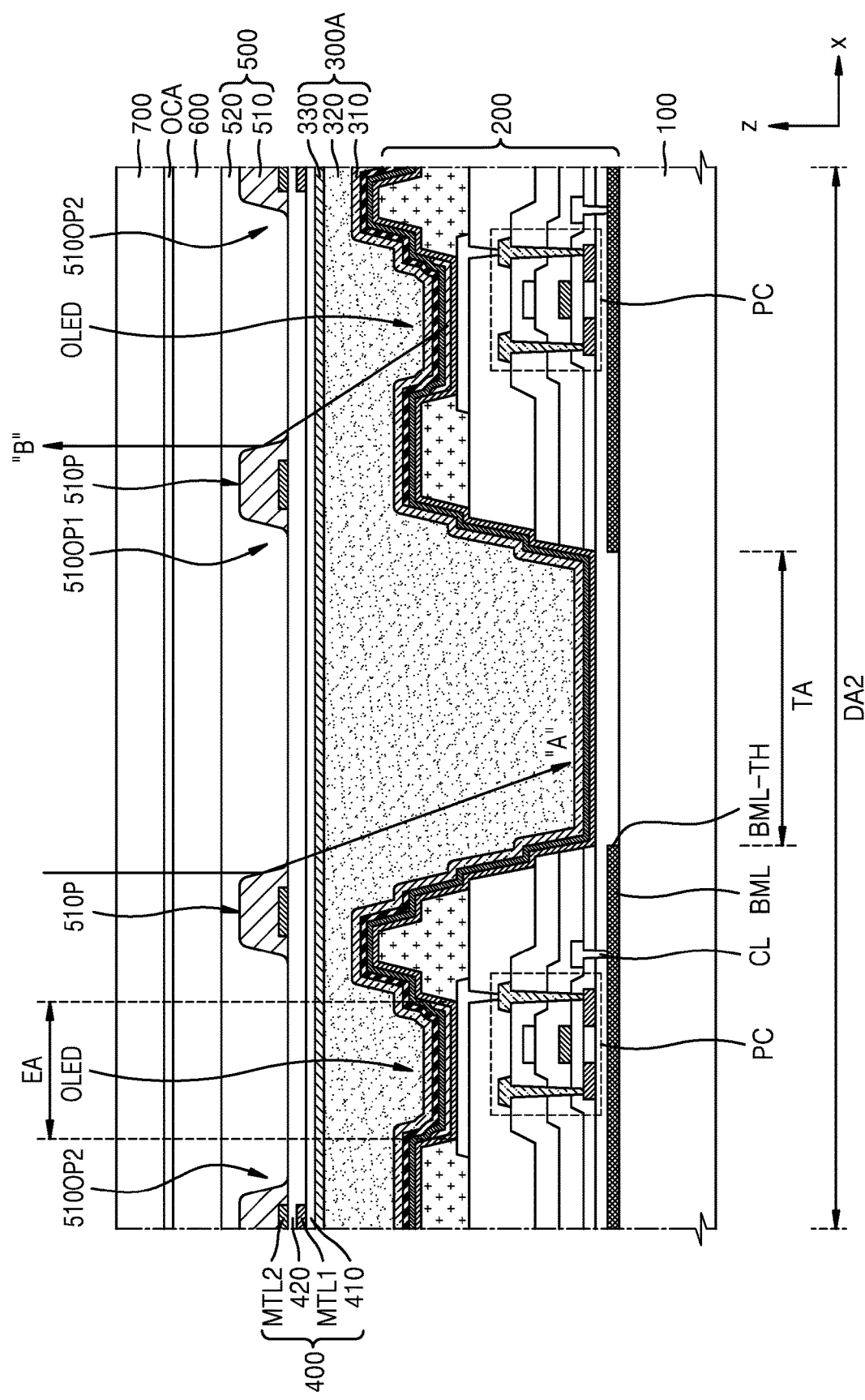
FIGS. 8A and 8B are cross-sectional views of a display device according to some example embodiments.
Figure 8B:
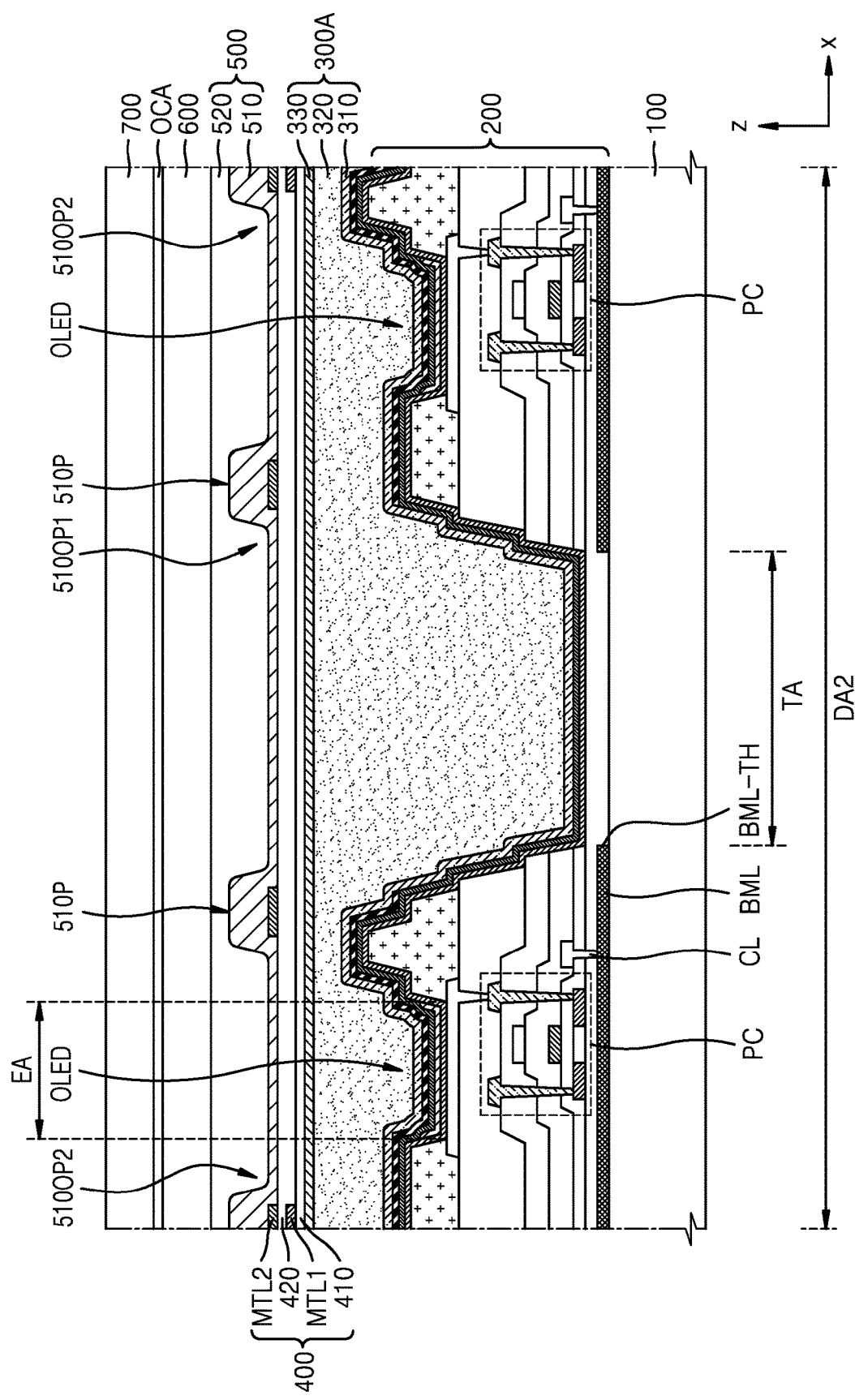

FIGS. 8A and 8B are cross-sectional views of the display device according to some example embodiments. FIGS. 8A and 8B show a cross-sectional structure of the display device in the second display area DA2.

Referring to FIGS. 8A and 8B, the structure of the substrate 100, the display layer 200, and the thin-film encapsulation layer 300A is the same as that described above with reference to FIG. 7. Hereinafter, a structure on the thin-film encapsulation layer 300A is described.

The input sensing layer 400 may include a first conductive layer MTL1 and a second conductive layer MTL2 each including a sensing electrode and/or a trace line, etc. An organic insulating layer 410 may be arranged between the thin-film encapsulation layer 300A and the first conductive layer MTL1. A second insulating layer 420 may be arranged between the first conductive layer MTL1 and the second conductive layer MTL2.

The first conductive layer MTL1 and the second conductive layer MTL2 may include a conductive material. The conductive material may include molybdenum (Mo), aluminum (Al), copper (Cu), and titanium (Ti) and include a single layer or a multi-layer including the above materials. According to some example embodiments, the first conductive layer MTL1 and the second conductive layer MTL2 may have a structure of Ti/Al/Ti in which a titanium layer, an aluminum layer, and a titanium layer are sequentially stacked.

The organic insulating layer 410 and the second insulating layer 420 may include an inorganic insulating material and/or an organic insulating material. The inorganic insulating material may include silicon oxide, silicon nitride, and silicon oxynitride. The organic insulating material may include an acrylic-based organic material and an imide-based organic material.

The optical functional layer 500 may include a first layer 510 and a second layer 520 on the first layer 510. The first layer 510 may include an insulating material having a first refractive index, and the second layer 520 may include an insulating material having a second refractive index greater than the first refractive index.

The first refractive index of the first layer 510 may be in the range, for example, from about 1.3 to about 1.6. According to some example embodiments, the first refractive index of the first layer 510 may be in the range, for example, from about 1.4 to about 1.55. For example, the first layer 510 may include an acryl-based organic material having a refractive index of about 1.5. The first layer 510 may include (ethyl) exyl acrylate, pentafluoropropyl acrylate, poly(ethylene glycol) dimethacrylate, or ethylene glycol dimethacrylate.

The first layer 510 may include a first opening 510OP1 and a second opening 510OP2. the first opening 510OP1 overlapping the transmission area TA, and the second opening 510OP2 overlapping the emission area EA. According to some example embodiments, as described in FIGS. 6A to 6B, the display device may include a plurality of transmission areas TA, and first openings 510OP1 each overlaps corresponding transmission area TA. The first layer 510 may includes a plurality of second openings 510OP2 each overlapping a corresponding emission area EA (or pixel). A slope portion 510P may be arranged near each of the first opening 510OP1 and the second opening 510OP2. The slope portion 510P may include a material of the first layer 510 and have a shape relatively further protruding upward than the first opening 510OP1 and the second opening 510OP2. A lateral surface of the slope portion 510P may include a forward-tapered slope surface. For example, a lateral surface of the slope portion 510P may include a tapered slope surface having an acute angle with respect to a layer thereunder, for example, a top surface of the input sensing layer 400 or a top surface of the thin-film encapsulation layer 300A.

The first layer 510 may include a protective layer that passivates a conductive layer of the input sensing layer 400, for example, the second conductive layer MTL2. For example, the slope portion 510P may overlap the second conductive layer MTL2 and cover the second conductive layer MTL2.

The first opening 510OP1 and the second opening 510OP2 of the first layer 510 may have the shape of a through hole as shown in FIG. 8A, or have the shape of a blind hole as shown in FIG. 8B. In the present specification, the opening of the first layer 510 denotes a concave portion of the first layer 510 formed while a portion of the first layer 510 is removed in a thickness direction of the first layer 510. The opening of the first layer 510 may have the shape of a through hole formed while a portion of the first layer 510 is entirely removed in the thickness direction of the first layer 510, or have the shape of a blind hole formed while a portion of the first layer 510 is partially removed in the thickness direction of the first layer 510. According to some example embodiments, the first opening 510OP1 and the second opening 510OP2 may have the shape of a through hole having substantially the same depth as the thickness of the first layer 510 while a portion of the first layer 510 is entirely removed in the thickness direction of the first layer 510 (see FIG. 8A). According to some example embodiments, the first opening 510OP1 and the second opening 510OP2 may have the shape of a through hole having a depth less than the thickness of the first layer 510 while a portion of the first layer 510 is partially removed in the thickness direction of the first layer 510 (see FIG. 8B).

The second layer 520 may include a planarization layer having a second refractive index. The second refractive index of the second layer 520 may be in the range from about 1.65 to about 1.85. The second layer 520 may include at least one of an acryl-based organic material or a siloxane-based organic material. According to some example embodiments, the second layer 520 may include polydiarylsiloxane, methyltrimethoxysilane, or tetramethoxysilane.

The second layer 520 may be formed right on the first layer 510. Therefore, the second layer 520 may directly contact the first layer 510. Some portions of the second layer 520 may respectively exist in the first opening 510OP1 and the second opening 510OP2 and contact a layer thereunder, for example, the input sensing layer 400.

Because the slope portion 510P of the first layer 510 is arranged near the transmission area TA, light progressing toward the substrate 100, for example, the component 20 (see FIG. 7) from the outside may progress along a path "A". As a comparative example, in the case where the first layer 510 does not include the first opening 510OP1, light progressing toward the component 20 in a direction (e.g. a (−) z-direction) perpendicular to the substrate 100 from the outside may be diffracted near an edge defining the through hole BML-TH of the bottom metal layer BML. The diffracted light may be incident to the component 20. Because the diffracted light includes a kind of noise, the component 20 may have distorted information. According to some example embodiments, in the case where the component 20 includes a camera including an image sensor, an image captured by the camera may be different from an actual image.

However, according to some example embodiments, because the optical functional layer 500 has the above-described structure, light progressing toward the substrate 100 from the outside progresses along the path "A" and accordingly the diffraction by the bottom metal layer BML itself may be prevented or minimized.

The slope portion 510P of the first layer 510 may be arranged near the emission area EA. Light emitted from the organic light-emitting diode OLED may progress along a path "B". Therefore, a light efficiency of the display device, for example, a front light efficiency and/or a lateral light efficiency may be improved.

The reflection prevention layer 600 may be arranged on the optical functional layer 500. According to some example embodiments, the reflection prevention layer 600 may include an optical plate including a retarder and/or a polarizer. Alternatively, a reflection prevention structure having various embodiment forms as described with reference to FIG. 2A may be provided. The window 700 may be arranged on the reflection prevention layer 600. An adhesive layer such as an optical clear adhesive OCA may be arranged therebetween as described above.

FIGS. 9A to 9E are plan views of a slope portion of the first layer of the optical functional layer around the transmission area TA and the bottom metal layer BML in the display device according to some example embodiments.

Figure 9A:
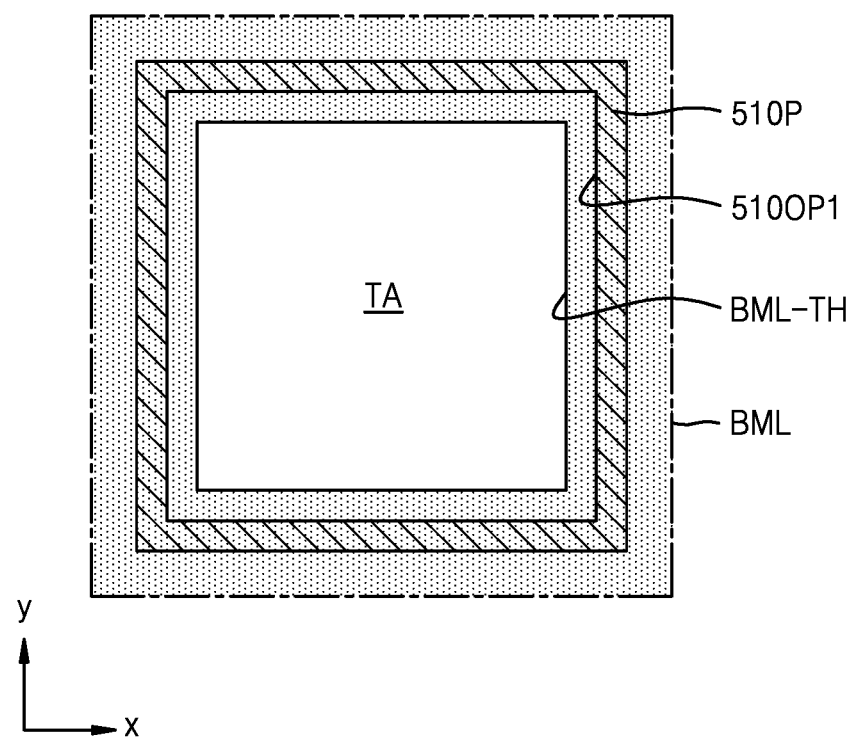
Figure 9B:
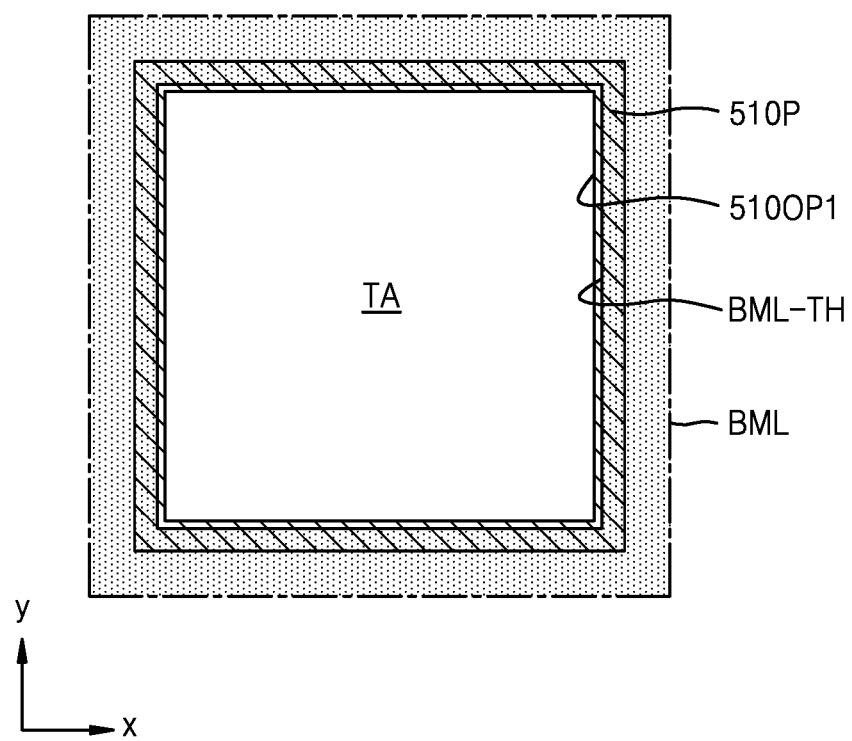

Referring to FIGS. 9A and 9B, the transmission area TA may be entirely surrounded by the slope portion 510P of the first layer of the optical functional layer. An inner surface of the slope portion 510P includes a region in which the first opening 510OP1 is located. The first opening 510OP1 may be entirely surrounded by the slope portion 510P.

The first opening 510OP1 may overlap the through hole BML-TH of the bottom metal layer BML. According to some example embodiments, the size or width of the first opening 510OP1 may be greater than the size or width of the through hole BML-TH of the bottom metal layer BML as shown in FIG. 9A. According to some example embodiments, the size or width of the first opening 510OP1 may be less than the size or width of the through hole BML-TH of the bottom metal layer BML as shown in FIG. 9B. In this case, the slope portion 510P of the first layer may partially overlap the edge of the through hole BML-TH of the bottom metal layer BML in a plan view.

Figure 9D:
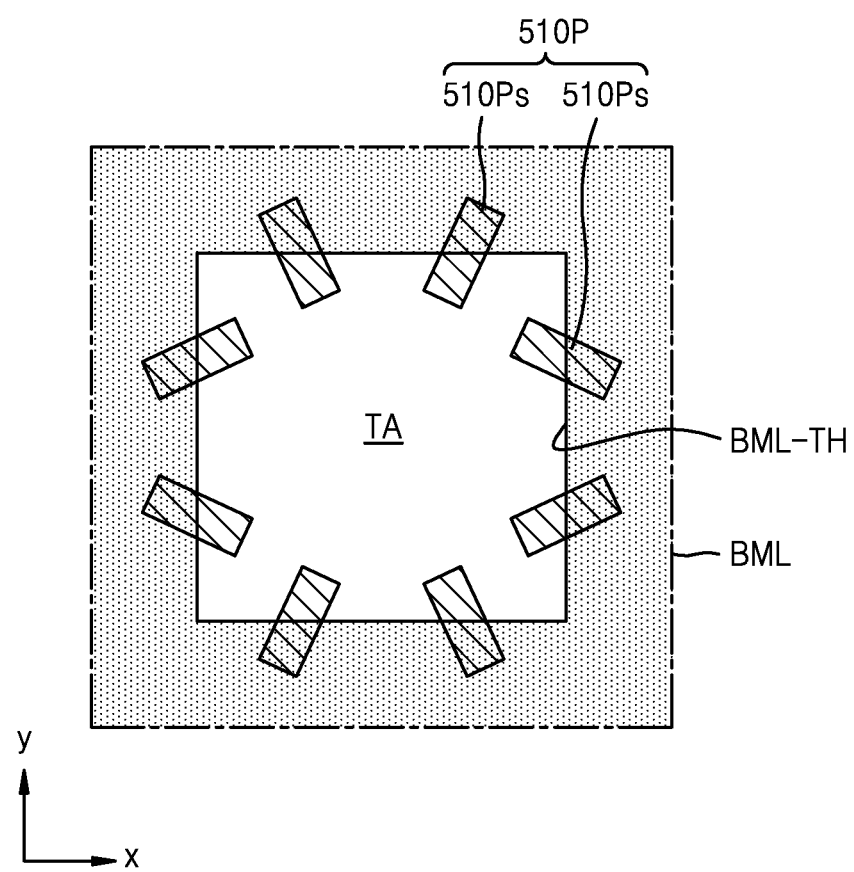
Figure 9E:
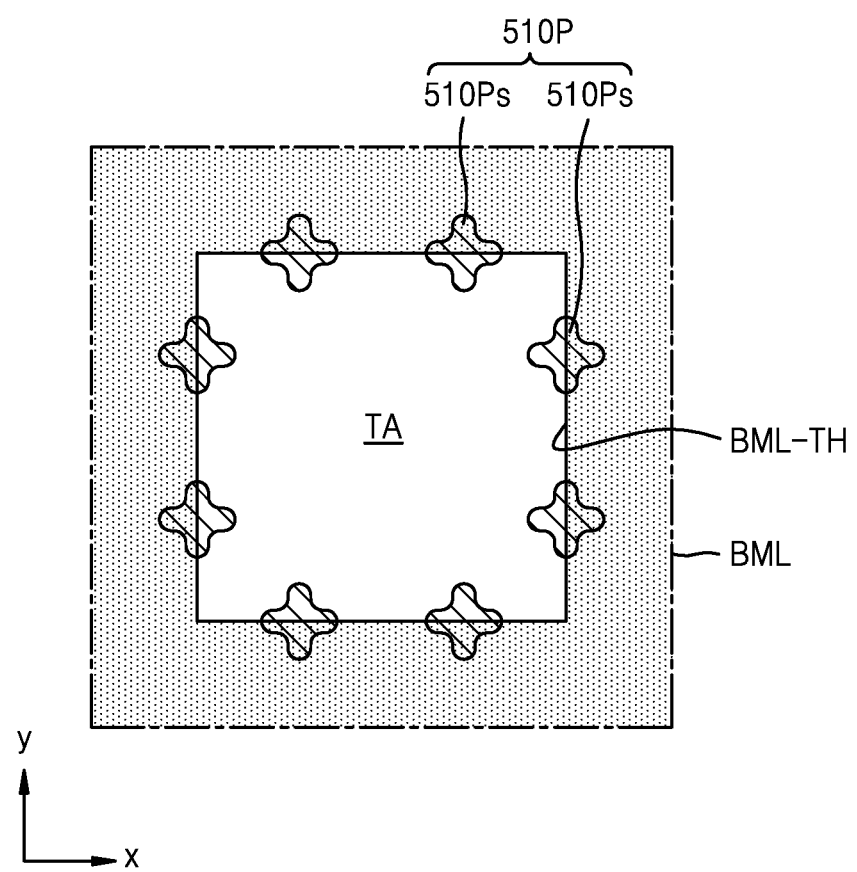

Though it is shown in FIGS. 9A and 9B that the transmission area TA is entirely surrounded by the slope portion 510P, the slope portion 510P may include a plurality of sub-portions 510Ps apart from each other along a periphery of the transmission area TA in a plan view as shown in FIGS. 9C to 9E.

The slope portion 510P may include the plurality of sub-portions 510Ps apart from each other along the edge of the transmission area TA. Each sub-portion 510Ps may have a circular shape as shown in FIG. 9C, a quadrangular shape as shown in FIG. 9D, or a shape having a concave or convex portion as shown in FIG. 9E. According to some example embodiments, neighboring sub-portions 510Ps may extend or be tilted in different directions as shown in FIG. 9D. In the case where the slope portions 510P are tilted in various directions and/or have an irregular shape, light progressing toward the component 20 (see FIG. 7) from the outside may be more effectively prevented from being diffracted near the through hole BML-TH of the bottom metal layer BML.

Though it is shown in FIGS. 9C to 9E that the sub-portion 510Ps overlaps the edge of the through hole BML-TH and the bottom metal layer BML that defines the through hole BML-TH, the sub-portion 510Ps may overlap only a metal portion of the bottom metal layer BML and may not overlap the through hole BML-TH as shown in FIG. 9A according to some example embodiments. For example, the sub-portion 510Ps may be arranged along the edge of the through hole BML-TH at the outer side of the through hole BML-TH of the bottom metal layer BML.

Figure 10:
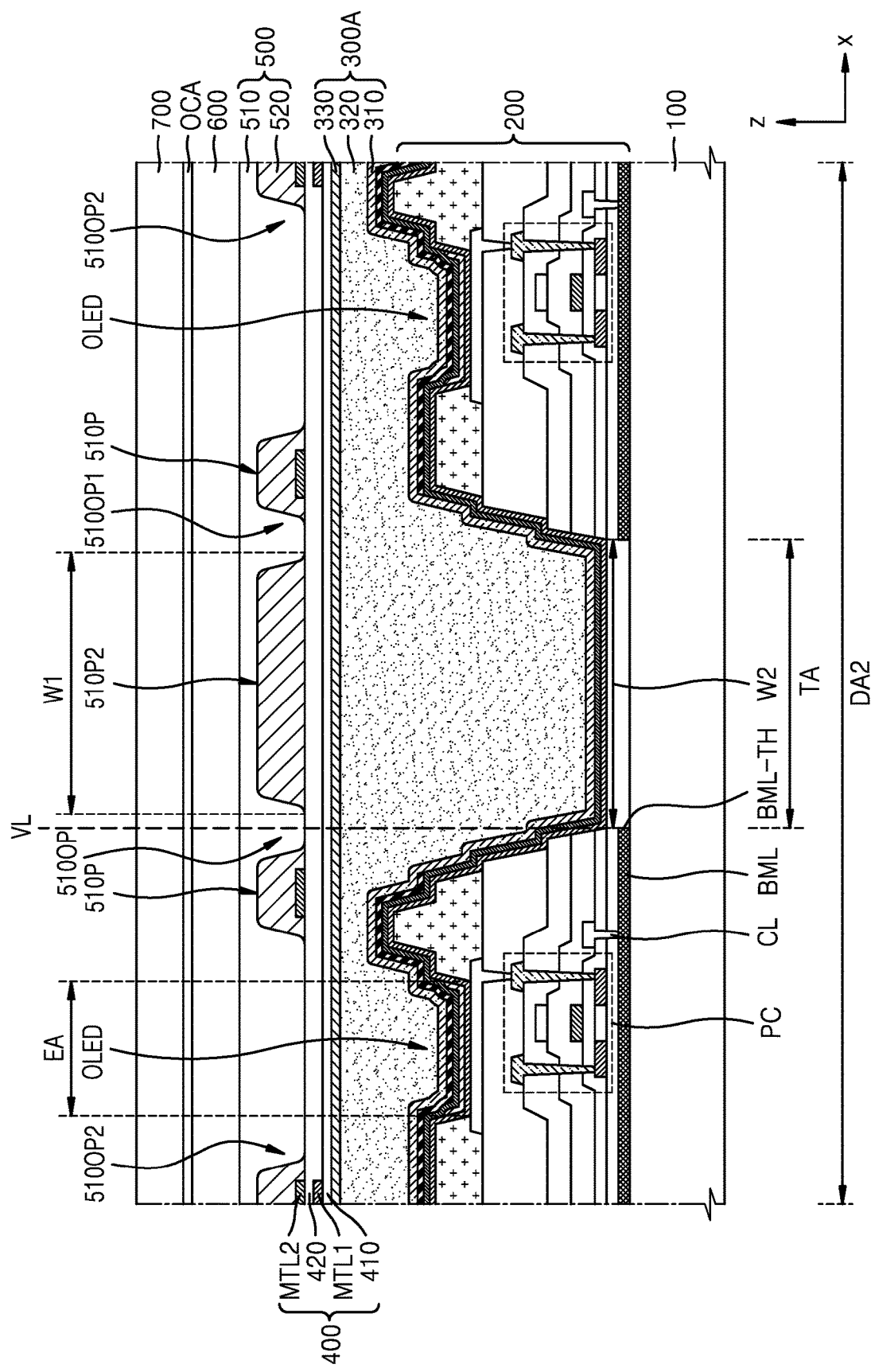
FIG. 10 is a cross-sectional view of a portion of a display device according to some example embodiments.

FIG. 10 is a cross-sectional view of a portion of the display device according to some example embodiments. FIG. 10 shows a cross-sectional structure of the second display area DA2 in the display device.

Referring to FIG. 10, the structures of the substrate 100, the display layer 200, and the thin-film encapsulation layer 300A are the same as those described above with reference to FIG. 7. The structure of the optical functional layer 500 may include all the characteristics described above with reference to FIG. 8.

The first layer 510 of the optical functional layer 500 may include the first opening 510OP1 and the second opening 510OP2, the first opening 510OP1 being located in the transmission area TA, and the second opening 510OP2 being located in the emission area EA. The slope portion 510P may be arranged around the first opening 510OP1 and the second opening 510OP2. In addition, the first layer 510 may further include an additional slope portion 510P2 inside the first opening 510OP1. Hereinafter, for convenience of description, the slope portion 510P is referred to as a first slope portion, and the additional slope portion 510P2 is referred to as a second slope portion.

The second slope portion 510P2 includes the same material as that of the first slope portion 510P and may be formed during the same process as a process of forming the first slope portion 510P. The second slope portion 510P2 may be apart from the first slope portion 510P. According to some example embodiments, a first width W1 of the second slope portion 510P2 may be less than a second width W2 of the through hole BML-TH of the bottom metal layer BML. The edge of the bottom metal layer BML that defines the through hole BML-TH may overlap the first opening 510OP1. For example, a portion of the first opening 510OP1 may be located on a virtual vertical line VL passing through the edge of the bottom metal layer BML that defines the through hole BML-TH. In other words, the edge of the bottom metal layer BML that defines the through hole BML-TH may be located between the first slope portion 510P and the second slope portion 510P2 in a plan view (when viewed in a direction perpendicular to the substrate 100).

The second layer 520 of the optical functional layer 500 may entirely cover the first slope portion 510P and the second slope portion 510P2. There may be a portion of the second layer 520 in the first opening 510OP1 and the second opening 510OP2.

A structure of the first slope portion 510P of the first layer 510 may have the same characteristics as those described above with reference to FIGS. 9A to 9E. Though it is shown in FIG. 10 that the first opening 510OP1 and the second opening 510OP2 have the shape of a through hole, the first opening 510OP1 and the second opening 510OP2 may have the shape of a blind hole according to some example embodiments. Though FIG. 10 shows the thin-film encapsulation layer 300A as an encapsulation member, the encapsulation member may include an encapsulation substrate according to some example embodiments.

Figure 11:
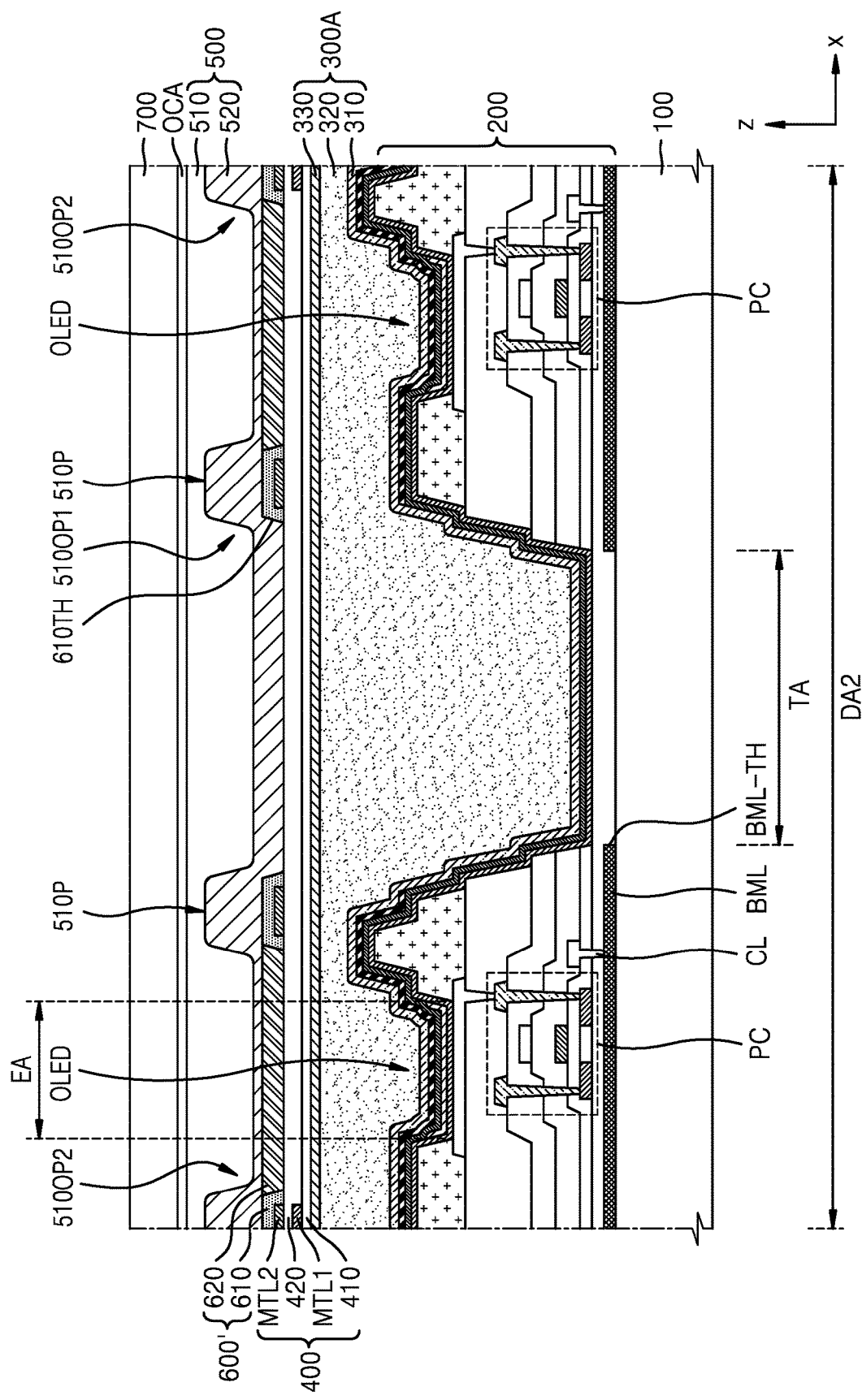
FIG. 11 is a cross-sectional view of a portion of a display device according to some example embodiments.

FIG. 11 is a cross-sectional view of a portion of the display device according to some example embodiments. FIG. 11 shows a cross-sectional structure of the second display area DA2 in the display device.

Referring to FIG. 11, the structures of the substrate 100, the display layer 200, the thin-film encapsulation layer 300A, and the input sensing layer 400 are the same as those described above with reference to FIG. 7. According to some example embodiments, as shown in FIG. 11, the optical functional layer 500 may be arranged on a reflection prevention layer 600'.

The reflection prevention layer 600' may include a black matrix (or light blocking layer) 610 and a color filter 620. The color filter 620 may be arranged in the emission area EA of the organic light-emitting diode OLED. The color filter 620 may include red, green, or blue pigment or dye depending on the color of light emitted from the organic light-emitting diode OLED.

The black matrix 610 may be located in a non-emission area and may surround the emission area EA. The black matrix 610 may include a through hole 610TH located in the transmission area TA. According to some example embodiments, the black matrix 610 may passivate a touch electrode of the input sensing layer 400. For example, as shown in FIG. 11, the second conductive layer MTL2 of the input sensing layer 400 including the touch electrode may overlap the black matrix 610 and be covered by the black matrix 610. The black matrix 610 may include an insulating material (e.g. an organic insulating material) including pigment or dye having a black color.

The optical functional layer 500 may include the first layer 510 and the second layer 520, the first layer 510 having the first refractive index, and the second layer 520 having the second refractive index. The second refractive index may be greater than the first refractive index.

The first refractive index of the first layer 510 may be in the range, for example, from about 1.3 to about 1.6. According to some example embodiments, the first refractive index of the first layer 510 may be in the range, for example, from about 1.4 to about 1.55. For example, the first layer 510 may include an acryl-based organic material having a refractive index of about 1.5. The first layer 510 may include (ethyl) exyl acrylate, pentafluoropropyl acrylate, poly(ethylene glycol) dimethacrylate, or ethylene glycol dimethacrylate.

The first layer 510 may include the first opening 510OP1 and the second opening 510OP2, the first opening 510OP1 overlapping the transmission area TA, and the second opening 510OP2 overlapping the emission area EA. The slope portion 510P may be arranged near each of the first opening 510OP1 and the second opening 510OP2, the slope portion 510P including a material of the first layer 510. According to some example embodiments, a lateral surface of the slope portion 510P may include a forward-tapered slope surface. For example, a lateral surface of the slope portion 510P may include a slope surface having an acute angle with respect to a top surface of a layer thereunder, for example, a top surface of the reflection prevention layer 600', a top surface of the input sensing layer 400, or a top surface of the thin-film encapsulation layer 300A.

The slope portion 510P may overlap a conductive layer of the input sensing layer 400, for example, the second conductive layer MTL2. The slope portion 510P may overlap the black matrix 610 on the second conductive layer MTL2.

The first opening 510OP1 and the second opening 510OP2 of the first layer 510 may have the shape of a blind hole as shown in FIG. 11. There may be a portion of the first layer 510 in the through hole 610TH of the black matrix 610.

The second layer 520 may include a planarization layer having the second refractive index. The second refractive index of the second layer 520 may be in the range from about 1.65 to about 1.85. The second layer 520 may include at least one of an acryl-based organic material or a siloxane-based organic material. According to some example embodiments, the second layer 520 may include polydiarylsiloxane, methyltrimethoxysilane, or tetramethoxysilane.

The second layer 520 may be formed right on the first layer 510. Therefore, the second layer 520 may directly contact the first layer 510. Some portions of the second layer 520 may respectively exist in the first opening 510OP1 and the second opening 510OP2 and contact a layer thereunder, for example, the input sensing layer 400.

The window 700 may be arranged on the optical functional layer 500. An adhesive layer such as an optical clear adhesive OCA may be arranged therebetween.

Though it is described in FIG. 11 that the first opening 510OP1 and the second opening 510OP2 of the first layer 510 have the shape of a blind hole, the first opening 510OP1 and the second opening 510OP2 may have the shape of a through hole according to some example embodiments. In this case, there may be a portion of the second layer 520 in the through hole 610TH of the black matrix 610. The slope portion 510P of the first layer 510 may have various shapes in a plan view as described with reference to FIGS. 9A to 9E. Though FIG. 11 shows the thin-film encapsulation layer 300A as the encapsulation member, the encapsulation member may include an encapsulation substrate according to some example embodiments.

Figure 12:
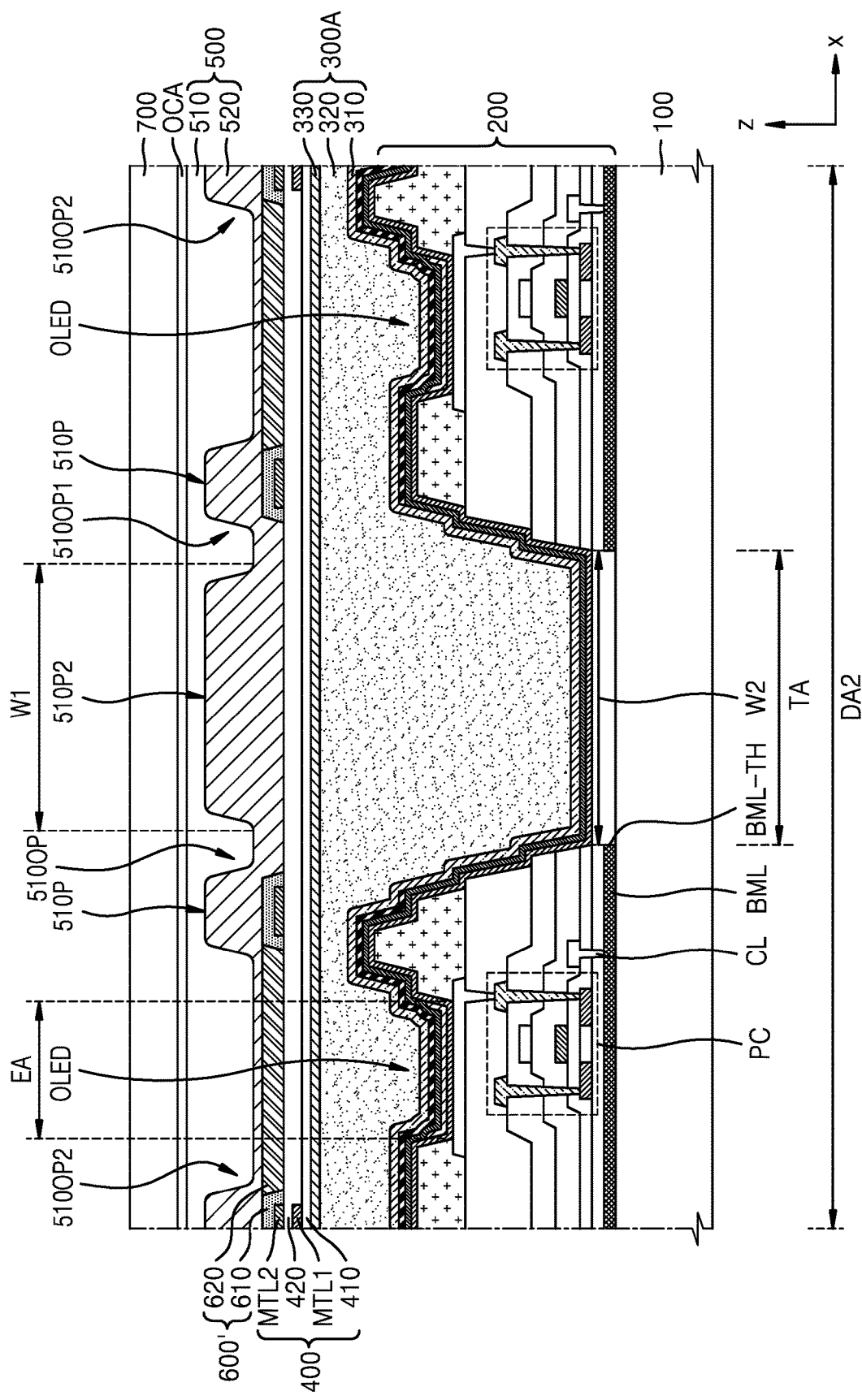
FIG. 12 is a cross-sectional view of a portion of a display device according to some example embodiments.

FIG. 12 is a cross-sectional view of a portion of the display device according to some example embodiments.

Referring to FIG. 12, the structures of the substrate 100, the display layer 200, and the thin-film encapsulation layer 300A are the same as those described above with reference to FIG. 7 or 8A. The structures of the optical functional layer 500 and the reflection prevention layer 600' may include all the characteristics described above with reference to FIG. 11.

The first layer 510 of the optical functional layer 500 may include the first opening 510OP1 and the second opening 510OP2, the first opening 510OP1 being located in the transmission area TA, and the second opening 510OP2 being located in the emission area EA. The slope portion 510P (the first slope portion) may be arranged around the first opening 510OP1 and the second opening 510OP2. In addition, the first layer 510 may further include the additional slope portion 510P2 (the second slope portion) inside the first opening 510OP1.

The second slope portion 510P2 includes the same material as that of the first slope portion 510P and may be formed during the same process as a process of forming the first slope portion 510P. The second slope portion 510P2 may be apart from the first slope portion 510P. According to some example embodiments, the first width W1 of the second slope portion 510P2 may be less than the second width W2 of the through hole BML-TH of the bottom metal layer BML. The edge of the bottom metal layer BML that defines the through hole BML-TH may overlap the first opening 510OP1. For example, as described in FIG. 10, a portion of the first opening 510OP1 may be located on a virtual vertical line VL (FIG. 10) passing through the edge of the bottom metal layer BML that defines the through hole BML-TH. In other words, the edge of the bottom metal layer BML that defines the through hole BML-TH may be located between the first slope portion 510P and the second slope portion 510P2 in a plan view (when viewed in a direction perpendicular to the substrate 100).

The second layer 520 may entirely cover the first slope portion 510P and the second slope portion 510P2. There may be a portion of the second layer 520 in the first opening 510OP1 and the second opening 510OP2.

The first slope portion 510P of the first layer 510 may have the same characteristics as those described above with reference to FIGS. 9A to 9E. Though it is shown in FIG. 12 that the first opening 510OP1 and the second opening 510OP2 have the shape of a blind hole, the first opening 510OP1 and the second opening 510OP2 may have the shape of a through hole according to some example embodiments. Though FIG. 12 shows the thin-film encapsulation layer 300A as the encapsulation member, the encapsulation member may include an encapsulation substrate according to some example embodiments.

The embodiments may provide a display panel which may display high-quality images and prevent the diffraction of light received by a component. This effect is provided as an example and the scope of embodiments according to the present disclosure are not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
   a substrate;
   two pixel circuits on the substrate spaced apart from each other with a transmission area therebetween, each of the two pixel circuits including a transistor and a storage capacitor;
   two display elements respectively electrically coupled to the two pixel circuits;
   a bottom metal layer between the substrate and the two pixel circuits and including a through hole corresponding to the transmission area;
   an encapsulation member on the two display elements; and
   an optical functional layer on the encapsulation member, wherein the optical functional layer includes:
   a first layer including a first opening, second openings, and a first slope portion, the first opening corresponding to the transmission area, the second openings corresponding to each of the two display elements, and the first slope portion being around the transmission area; and
   a second layer on the first layer and having a refractive index greater than a refractive index of the first layer.

2. The display device of claim 1, wherein the first slope portion entirely surrounds the transmission area in a plan view.

3. The display device of claim 1, wherein the first slope portion includes a plurality of sub-portions apart from one another.

4. The display device of claim 1, wherein a lateral surface of the first slope portion includes a forward-tapered slope surface.

5. The display device of claim 1, wherein the first layer further includes a second slope portion inside the first opening.

6. The display device of claim 5, wherein the first slope portion is apart from the second slope portion.

7. The display device of claim 6, wherein an edge of the bottom metal layer that defines the through hole is between the first slope portion and the second slope portion in a plan view.

8. The display device of claim 5, wherein a first width of the second slope portion is less than a second width of the through hole of the bottom metal layer.

9. The display device of claim 1, further comprising an input sensing layer between the encapsulation member and the optical functional layer, the input sensing layer including at least one conductive layer and an insulating layer, the at least one conductive layer including a sensing electrode or a trace line.

10. The display device of claim 9, wherein the first slope portion of the first layer overlaps the at least one conductive layer of the input sensing layer.

11. The display device of claim 9, further comprising a reflection prevention layer on the input sensing layer and including a black matrix and a color filter.

12. The display device of claim 11, wherein the first slope portion of the first layer of the optical functional layer overlaps the black matrix.

13. The display device of claim 12, wherein the black matrix includes a through hole corresponding to the transmission area, and a portion of the first layer is in the through hole of the black matrix.

14. An electronic apparatus comprising:
a display device including an array of a plurality of pixels, the plurality of pixels including two pixels spaced apart from each other with a transmission area therebetween; and
a component overlapping at least the transmission area, wherein the display device includes:
a display layer including the plurality of pixels;
a bottom metal layer including a through hole corresponding to the transmission area;
an encapsulation member on the display layer; and
an optical functional layer on the encapsulation member, wherein the optical functional layer includes:
a first layer including a first opening, second openings, and a first slope portion, the first opening corresponding to the transmission area, the second openings corresponding to each of the plurality of pixels, and the first slope portion being around the transmission area; and
a second layer on the first layer and having a refractive index greater than a refractive index of the first layer.

15. The electronic apparatus of claim 14, wherein a lateral surface of the first slope portion includes a slope surface forward-tapered with respect to a top surface of a lower layer under the first layer.

16. The electronic apparatus of claim 15, wherein the lower layer comprises an input sensing layer including at least one conductive layer and an insulating layer, the at least one conductive layer including a sensing electrode or a trace line.

17. The electronic apparatus of claim 16, wherein the first slope portion overlaps the at least one conductive layer of the input sensing layer.

18. The electronic apparatus of claim 16, wherein the lower layer further comprises a reflection prevention layer on the input sensing layer and including a black matrix and a color filter.

19. The electronic apparatus of claim 18, wherein the first slope portion of the first layer of the optical functional layer overlaps the black matrix.

20. The electronic apparatus of claim 18, wherein the black matrix includes a through hole corresponding to the transmission area, and a portion of the first layer is in the through hole of the black matrix.

21. The electronic apparatus of claim 14, wherein the first layer further includes a second slope portion inside the first opening.

22. The electronic apparatus of claim 21, wherein the first slope portion is apart from the second slope portion.

23. The electronic apparatus of claim 22, wherein an edge of the bottom metal layer that defines the through hole is between the first slope portion and the second slope portion in a plan view.

24. The electronic apparatus of claim 21, wherein a first width of the second slope portion is less than a second width of the through hole of the bottom metal layer.

25. The electronic apparatus of claim 14, wherein the component includes a sensor or a camera.

* * * * *